United States Patent
Iwamoto

(10) Patent No.: US 11,588,467 B2
(45) Date of Patent: Feb. 21, 2023

(54) ACOUSTIC WAVE DEVICE, ACOUSTIC WAVE DEVICE PACKAGE, MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/562,488

(22) Filed: Sep. 6, 2019

(65) Prior Publication Data

US 2019/0393857 A1 Dec. 26, 2019

Related U.S. Application Data

(63) Continuation of application No. PCT/JP2018/006418, filed on Feb. 22, 2018.

(30) Foreign Application Priority Data

Mar. 9, 2017 (JP) .............................. JP2017-044687

(51) Int. Cl.
*H03H 9/145* (2006.01)
*H03H 9/25* (2006.01)
(Continued)

(52) U.S. Cl.
CPC .... *H03H 9/02866* (2013.01); *H03H 9/02559* (2013.01); *H03H 9/02834* (2013.01);
(Continued)

(58) Field of Classification Search
CPC ................................................. H03H 9/64–76
See application file for complete search history.

(56) References Cited

U.S. PATENT DOCUMENTS

| 7,484,279 B2* | 2/2009 | Aoki | H03H 9/0547 29/25.35 |
| 7,659,653 B2* | 2/2010 | Matsuda | H03H 9/02929 310/313 B |

(Continued)

FOREIGN PATENT DOCUMENTS

| JP | 61-269509 A | 11/1986 |
| JP | 2009-524955 A | 7/2009 |

(Continued)

OTHER PUBLICATIONS

"Shear Wave", Encyclopedia Britannica, https://web.archive.org/web/20160422174055/http://www.britannica.com/science/shear-wave (Year: 2015).*

(Continued)

*Primary Examiner* — Samuel S Outten
*Assistant Examiner* — Alan Wong
(74) *Attorney, Agent, or Firm* — Keating & Bennett, LLP

(57) ABSTRACT

An acoustic wave device includes a support substrate made of silicon, a piezoelectric body provided directly or indirectly on the support substrate, the piezoelectric body including a pair of main surfaces facing each other, and an interdigital transducer electrode provided directly or indirectly on at least one of the main surfaces of the piezoelectric body, a wave length that is determined by an electrode finger pitch of the interdigital transducer electrode being $\lambda$. An acoustic velocity $V_{Si}=(V_1)^{1/2}$ of bulk waves that propagate in the support substrate, which is determined by $V_1$ out of solutions $V_1$, $V_2$, $V_3$ of x derived from the expression, $Ax^3+Bx^2+Cx+D=0$, is higher than or equal to about 5500 m/s.

20 Claims, 15 Drawing Sheets

(51) Int. Cl.
  *H03H 9/64* (2006.01)
  *H03H 9/02* (2006.01)
  *H03H 9/72* (2006.01)
  *H03H 9/05* (2006.01)
  *H03H 9/10* (2006.01)
  *H04B 1/00* (2006.01)

(52) U.S. Cl.
  CPC .......... *H03H 9/059* (2013.01); *H03H 9/1092* (2013.01); *H03H 9/145* (2013.01); *H03H 9/25* (2013.01); *H03H 9/6483* (2013.01); *H03H 9/6496* (2013.01); *H03H 9/72* (2013.01); *H04B 1/0057* (2013.01)

(56) References Cited

U.S. PATENT DOCUMENTS

| | | | | |
|---|---|---|---|---|
| 9,197,192 | B2 * | 11/2015 | Yamato | H03H 9/059 |
| 10,367,468 | B2 * | 7/2019 | Takamine | H03H 9/14594 |
| 10,536,133 | B2 * | 1/2020 | Burak | H03H 9/02574 |
| 10,778,181 | B2 * | 9/2020 | Goto | H03H 9/02559 |
| 10,848,121 | B2 * | 11/2020 | Inoue | H03H 9/02574 |
| 2010/0182101 | A1 | 7/2010 | Suzuki | |
| 2010/0225201 | A1 | 9/2010 | Roesler et al. | |
| 2010/0225202 | A1 | 9/2010 | Fukano et al. | |
| 2010/0244631 | A1 | 9/2010 | Kobayashi et al. | |
| 2012/0194032 | A1 | 8/2012 | Kadota | |
| 2013/0285768 | A1 * | 10/2013 | Watanabe | H03H 3/02 333/193 |
| 2015/0069882 | A1 | 3/2015 | Umeda et al. | |
| 2016/0248398 | A1 | 8/2016 | Kuroyanagi | |
| 2016/0359468 | A1 | 12/2016 | Taniguchi et al. | |
| 2017/0250674 | A1 | 8/2017 | Takamine et al. | |
| 2018/0102761 | A1 | 4/2018 | Takai et al. | |
| 2018/0123556 | A1 | 5/2018 | Takamine | |
| 2018/0152170 | A1 | 5/2018 | Iwamoto | |

FOREIGN PATENT DOCUMENTS

| | | | |
|---|---|---|---|
| JP | 2010-187373 A | 8/2010 | |
| JP | 2010-232725 A | 10/2010 | |
| JP | 2012-010054 A | 1/2012 | |
| JP | 2016-152612 A | 8/2016 | |
| WO | 2009/057699 A1 | 5/2009 | |
| WO | 2011/046117 A1 | 4/2011 | |
| WO | 2013/172251 A1 | 11/2013 | |
| WO | 2015/151706 A1 | 10/2015 | |
| WO | 2016/103953 A1 | 6/2016 | |
| WO | 2016/208447 A1 | 12/2016 | |
| WO | WO-2016208447 A1 * | 12/2016 | .......... H04B 1/0057 |
| WO | 2017/013968 A1 | 1/2017 | |
| WO | 2017/043394 A1 | 3/2017 | |
| WO | 2017/209131 A1 | 12/2017 | |

OTHER PUBLICATIONS

Official Communication issued in corresponding Japanese Patent Application No. 2019-504463, dated Jul. 28, 2020.

Official Communication issued in Japanese Patent Application No. 2019-504463, dated Nov. 12, 2019.

Official Communication issued in International Patent Application No. PCT/JP2018/006418, dated May 1, 2018.

* cited by examiner

ACOUSTIC WAVE DEVICE, ACOUSTIC WAVE DEVICE PACKAGE, MULTIPLEXER, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-044687 filed on Mar. 9, 2017 and is a Continuation Application of PCT Application No. PCT/JP2018/006418 filed on Feb. 22, 2018. The entire contents of each application are hereby incorporated herein by reference.

BACKGROUND OF THE INVENTION

1. Field of the Invention

The present invention relates to an acoustic wave device including a support substrate made of silicon, an acoustic wave device package, a multiplexer, a radio-frequency front-end circuit, and a communication device.

2. Description of the Related Art

Various acoustic wave devices that include a support substrate made of silicon have been suggested. Japanese Unexamined Patent Application Publication No. 2010-187373 describes an acoustic wave device in which an organic adhesion layer and a piezoelectric substrate are laminated on a support substrate made of silicon. Heat resistance is increased by bonding on a (111) surface of the support substrate made of silicon.

In Japanese Unexamined Patent Application Publication No. 2010-187373, depending on the crystal orientation of the support substrate made of silicon, the acoustic velocity of bulk waves that propagate in the support substrate can change, and the frequency positions of higher modes that propagate in the support substrate can vary. When the frequency positions of higher modes that propagate in the support substrate vary, there is a problem that the likelihood of an occurrence of the response of higher modes at undesired frequency positions increases.

SUMMARY OF THE INVENTION

Preferred embodiments of the present invention provide acoustic wave devices in each of which the frequency positions of higher modes that propagate in a support substrate made of silicon hardly vary. Preferred embodiments of the present invention also provide acoustic wave device packages, multiplexers, radio-frequency front-end circuits, and communication devices that include the acoustic wave devices.

An acoustic wave device according to a preferred embodiment of the present invention includes a support substrate made of silicon, a piezoelectric body provided directly or indirectly on the support substrate, the piezoelectric body including a pair of main surfaces facing each other, and an interdigital transducer electrode provided directly or indirectly on at least one of the main surfaces of the piezoelectric body, a wave length that is determined by an electrode finger pitch of the interdigital transducer electrode being $\lambda$. An acoustic velocity $V_{Si}$ in the following mathematical expression (1), which is an acoustic velocity of bulk waves that propagate in the support substrate, is higher than or equal to about 5500 m/s.

$$V_{Si} = (V_1)^{1/2} \text{(m/s)} \qquad \text{expression (1)}$$

$V_1$ in the mathematical expression (1) is a solution to the following mathematical expression (2).

$$Ax^3 + Bx^2 + Cx + D = 0 \qquad \text{expression (2)}$$

In the mathematical expression (2), A, B, C, and D are respectively values expressed by the following mathematical expressions (2A) to (2D).

$$A = -\rho^3 \qquad \text{expression (2A)}$$

$$B = \rho^2 (L_{11} + L_{22} + L_{33}) \qquad \text{expression (2B)}$$

$$C = \rho(L_{21}^2 + L_{23}^2 + L_{31}^2 - L_{11} \cdot L_{33} - L_{22} \cdot L_{33} - L_{11} \cdot L_{22}) \qquad \text{expression (2C)}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \qquad \text{expression (2D)}$$

In the mathematical expression (2A), the mathematical expression (2B), the mathematical expression (2C), or the mathematical expression (2D), $\rho$ is about 2.331 (g/cm$^3$). $L_{11}$, $L_{22}$, $L_{33}$, $L_{21}$, $L_{31}$, and $L_{23}$ are values expressed by the following mathematical expressions (3A) to (3F).

$$L_{11} = c_{11} \cdot a_1^2 + c_{44} \cdot a_2^2 + c_{44} \cdot a_3^2 \qquad \text{expression (3A)}$$

$$L_{22} = c_{44} \cdot a_1^2 + c_{11} \cdot a_2^2 + c_{44} \cdot a_3^2 \qquad \text{expression (3B)}$$

$$L_{33} = c_{44} \cdot a_1^2 + c_{44} \cdot a_2^2 + c_{11} \cdot a_3^2 \qquad \text{expression (3C)}$$

$$L_{21} = (c_{12} + c_{44}) \cdot a_2 \cdot a_1 \qquad \text{expression (3D)}$$

$$L_{31} = (c_{12} + c_{44}) \cdot a_1 \cdot a_3 \qquad \text{expression (3E)}$$

$$L_{23} = (c_{44} + c_{12}) \cdot a_3 \cdot a_2 \qquad \text{expression (3F)}$$

In the mathematical expressions (3A) to (3F), $c_{11}$ is about 1.674E+11 (N/m$^2$), $c_{12}$ is about 6.523E+10 (N/m$^2$), and $c_{44}$ is about 7.957E+10 (N/m$^2$), $a_1$, $a_2$, and $a_3$ are values expressed by the following mathematical expressions (4A) to (4C).

$$a_1 = \cos(\phi) \cdot \cos(\psi) - \sin(\phi) \cdot \cos(\theta) \cdot \sin(\psi) \qquad \text{expression (4A)}$$

$$a_2 = \sin(\phi) \cdot \cos(\psi) + \cos(\phi) \cdot \cos(\theta) \cdot \sin(\psi) \qquad \text{expression (4B)}$$

$$a_3 = \sin(\theta) \cdot \sin(\psi) \qquad \text{expression (4C)}$$

$\phi$, $\theta$, and $\psi$ in the mathematical expressions (4A) to (4C) are $\phi$, $\theta$, and $\psi$ in a crystal orientation ($\phi$, $\theta$, $\psi$) of the support substrate.

In an acoustic wave device according to a preferred embodiment of the present invention, $V_1$ in the mathematical expression (1) is a minimum value among solutions $V_1$, $V_2$, and $V_3$ to the mathematical expression (2). With this configuration, the frequency positions of higher modes are further effectively stabilized.

In an acoustic wave device according to a preferred embodiment of the present invention, the film thickness of the piezoelectric body is less than or equal to about 3.5$\lambda$. When the film thickness of the piezoelectric body is less than or equal to about 3.5$\lambda$, the degree of energy concentration of acoustic waves is increased, so a loss is able to be reduced.

In an acoustic wave device according to a preferred embodiment of the present invention, the piezoelectric body is made of lithium tantalate.

In an acoustic wave device according to a preferred embodiment of the present invention, the acoustic velocity of bulk waves that propagate through the support substrate is higher than an acoustic velocity of acoustic waves that propagate through the piezoelectric body. In this case, the quality factor is increased.

In an acoustic wave device according to a preferred embodiment of the present invention, the acoustic wave device further includes a low acoustic velocity material layer provided between the support substrate and the piezoelectric body, the low acoustic velocity material layer being made of a low acoustic velocity material through which bulk waves propagate at an acoustic velocity lower than an acoustic velocity of acoustic waves that propagate through the piezoelectric body. In this case, acoustic waves are effectively enclosed in the piezoelectric body. When the low acoustic velocity material layer is disposed, the acoustic velocity of acoustic waves decreases. The energy of acoustic waves substantially concentrates in a low acoustic velocity medium. Therefore, the effect of enclosing acoustic wave energy into the piezoelectric body and the interdigital transducer electrode in which acoustic waves are excited is improved. As a result, in comparison with the case where no low acoustic velocity material layer is provided, a loss is reduced, and the quality factor is increased.

In an acoustic wave device according to a preferred embodiment of the present invention, a film thickness of the low acoustic velocity material layer is less than or equal to about 2λ. In this case, when the film thickness of a low acoustic velocity film that defines and functions as the low acoustic velocity material layer is selected within the range less than or equal to about 2λ, the electromechanical coupling coefficient can be easily adjusted. In addition, warpage of the acoustic wave device due to the membrane stress of the low acoustic velocity film is reduced. Therefore, the flexibility of design is increased. The easy-to-use and high-quality acoustic wave device is provided.

In an acoustic wave device according to a preferred embodiment of the present invention, the low acoustic velocity material layer is made of silicon oxide.

In an acoustic wave device according to a preferred embodiment of the present invention, the piezoelectric body is made of lithium tantalate, and the low acoustic velocity material layer is made of silicon oxide.

In an acoustic wave device according to a preferred embodiment of the present invention, the acoustic wave device further includes a high acoustic velocity material layer provided between the support substrate and the low acoustic velocity material layer, the high acoustic velocity material layer being made of a high acoustic velocity material through which bulk waves propagate at an acoustic velocity higher than an acoustic velocity of acoustic waves that propagate through the piezoelectric body.

In an acoustic wave device according to a preferred embodiment of the present invention, in a multiplexer including a plurality of band pass filters having different pass bands, the acoustic wave device is used in the band pass filter whose pass band is lower than the pass band of at least another one of the band pass filters. In this case, the frequency positions of higher modes in the acoustic wave device just need to be set so as to avoid the pass band of at least another one of the band pass filters. Thus, deterioration of characteristics of the other one of the band pass filters is effectively reduced.

In an acoustic wave device according to a preferred embodiment of the present invention, the thickness of the support substrate is greater than or equal to about 10λ and less than or equal to about 180 μm, and λ is less than or equal to about 18 μm. In this case, since the thickness of the support substrate is greater than or equal to about 10λ, the phase maximum values of higher modes are reduced. In other words, to reduce or prevent the intensity of response of higher modes, it is preferable that the thickness of the support substrate is greater than or equal to about 10λ. When the thickness of the support substrate is less than or equal to about 180 μm, a heat radiation property is improved, and a low profile is achieved.

An acoustic wave device according to a preferred embodiment of the present invention further includes a dielectric layer provided between the piezoelectric body and the interdigital transducer electrode. In this case, the fractional band width of the resonator can be adjusted with the film thickness of the dielectric layer. Therefore, when a fractional band width suitable for a band width that is required for each pass band is selected, filter characteristics are able to be improved.

In an acoustic wave device according to a preferred embodiment of the present invention, the dielectric layer is made of silicon oxide or tantalum pentoxide. In this case, the frequency-temperature characteristics of the acoustic wave device are improved. When the dielectric layer is provided, the distribution of energy of acoustic waves can be varied. Thus, the temperature characteristics of the device can be adjusted.

In an acoustic wave device according to a preferred embodiment of the present invention, the dielectric layer is made of silicon oxide. In this case, acoustic waves are effectively enclosed in the piezoelectric body, and the frequency-temperature characteristics are further effectively improved. When a material has positive frequency-temperature characteristics, such as silicon oxide, the frequency-temperature characteristics are improved. Silicon oxide is a low acoustic velocity material, and the energy of acoustic waves generally concentrates on a low acoustic velocity material, so the effect of enclosing acoustic waves is improved.

An acoustic wave device according to a preferred embodiment of the present invention further includes a support layer provided on the support substrate and surrounding the interdigital transducer electrode, a cover member covering the support layer and providing a hollow space surrounding the interdigital transducer electrode, and a plurality of metal bumps provided on the cover member and electrically connected to the interdigital transducer electrode. In this case, the acoustic wave device having a WLP structure is provided. The support layer, surrounding the electrode, and the cover member define a hollow space surrounding the interdigital transducer electrode. Even when the outer side portion is covered with a resin, the hollow space is maintained. Therefore, excitation of acoustic waves is not hindered. Since the metal bumps connected to the interdigital transducer electrode are provided, an electrical signal can be extracted. In other words, with this configuration, packaging (WLP) at wafer level is possible.

An acoustic wave device according to a preferred embodiment of the present invention further includes a support layer provided on the support substrate and a cover member covering the support layer, the cover member providing a hollow space surrounding the interdigital transducer electrode, the cover member being made of an inorganic material. In a region surrounded by the support layer, at least one through via extending through the support substrate and at least one terminal electrode electrically connected to the at least one through via and provided on a surface on an opposite side of the support substrate from a side on which the interdigital transducer electrode is provided, are provided on or in the support substrate, and the at least one through via is electrically connected to the interdigital transducer electrode and the at least one terminal electrodes. In this case, since the cover member is made of an inorganic material and has a high strength, mold resistance is increased. Since the terminal electrodes are provided on a surface on an opposite side of the support substrate from a side on which the interdigital transducer electrode is provided, miniaturization is achieved as compared to when the terminal electrodes are provided on the cover member side. Particularly, when an inorganic material that defines and functions as the material of the cover member is silicon, the difference in coefficient of linear expansion between the cover member and the support substrate is small, so cracking under thermal load is reduced.

An acoustic wave device package according to a preferred embodiment of the present invention includes a case substrate on one of surfaces of which a plurality of electrode lands is provided, and an acoustic wave device according to a preferred embodiment of the present invention. At least one metal bump electrically connected to the interdigital transducer electrode is provided on the acoustic wave device, the at least one metal bump is joined with at least one of the electrode lands, and the acoustic wave device package further includes a sealing resin layer provided on the case substrate so as to seal the acoustic wave device. In this case, when the case substrate having a high strength is used, mold resistance is increased. When the case substrate is a multilayer substrate, an inductor can be incorporated in the case substrate. When the metal bumps are made of Au, thermal shock resistance increases.

In an acoustic wave device package according to a preferred embodiment of the present invention, a case substrate on one of surfaces of which a plurality of electrode lands is provided, and an acoustic wave device according to a preferred embodiment of the present invention, the acoustic wave device being mounted on the case substrate and having a WLP structure. The plurality of metal bumps are joined with the plurality of electrode lands on the case substrate, and the acoustic wave device package further includes a sealing resin layer provided so as to seal the acoustic wave device.

A multiplexer according to a preferred embodiment of the present invention includes a band pass filter including an acoustic wave device according to a preferred embodiment of the present invention, and at least another band pass filter whose one end is connected to one end of the band pass filter. A frequency position of a higher mode in the acoustic wave device lies outside a pass band of the at least one other band pass filter. In this case, deterioration of characteristics of the other band pass filter due to higher modes can be reduced or prevented.

With the acoustic wave devices, the acoustic wave device packages, and the multiplexers according to preferred embodiments of the present invention, variations in the frequency positions of higher modes that propagate in the support substrate made of silicon hardly occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be disclosed by describing specific preferred embodiments of the present invention with reference to the drawings.

The preferred embodiments that will be described in this specification are illustrative and partial replacement or combination of components is possible among the different preferred embodiments.

Figure 1A:
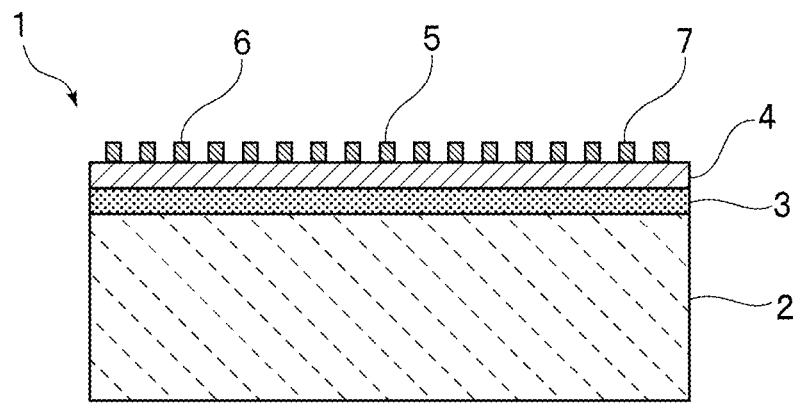
FIG. 1A is a front cross-sectional view of an acoustic wave device according to a first preferred embodiment of the present invention.

FIG. 1A is a front cross-sectional view of the acoustic wave device according to a first preferred embodiment of the present invention. The acoustic wave device 1 includes a support substrate 2 preferably made of silicon, for example. The support substrate 2 has a monocrystal structure with a crystal orientation. The support substrate 2 need not have a monocrystal structure as long as the support substrate 2 has a crystal orientation. The support substrate 2 may partially include a substance that contains impurities. This applies not only to the first preferred embodiment but also to all of the following preferred embodiments.

A low acoustic velocity film 3 that defines and functions as a low acoustic velocity material layer is laminated directly on the support substrate 2. For example, $SiO_2$ is preferably used as the low acoustic velocity film 3. Alternatively, silicon oxide other than $SiO_2$ may be used. A piezoelectric body 4 may be laminated indirectly on the low acoustic velocity film 3. The low acoustic velocity film 3 is not indispensable.

A low acoustic velocity material of the low acoustic velocity film 3 is a material through which bulk waves propagate at an acoustic velocity lower than the acoustic velocity of acoustic waves that propagate through a piezoelectric body (described later).

Examples of the low acoustic velocity material include silicon oxide, glass, silicon oxynitride, tantalum oxide, and a medium containing any one of these materials, such as a compound obtained by adding fluorine, carbon, or boron to silicon oxide, as a main ingredient.

Therefore, a dielectric film may be used as the low acoustic velocity film 3. Since a piezoelectric monocrystal, such as $LiTaO_3$ and $LiNbO_3$, has negative frequency-temperature characteristics, a material having positive frequency-temperature characteristics is preferable as the dielectric film. Therefore, silicon oxide or silicon oxynitride, for example, is preferably used.

The piezoelectric body 4 is laminated on the low acoustic velocity film 3.

Figure 1B:
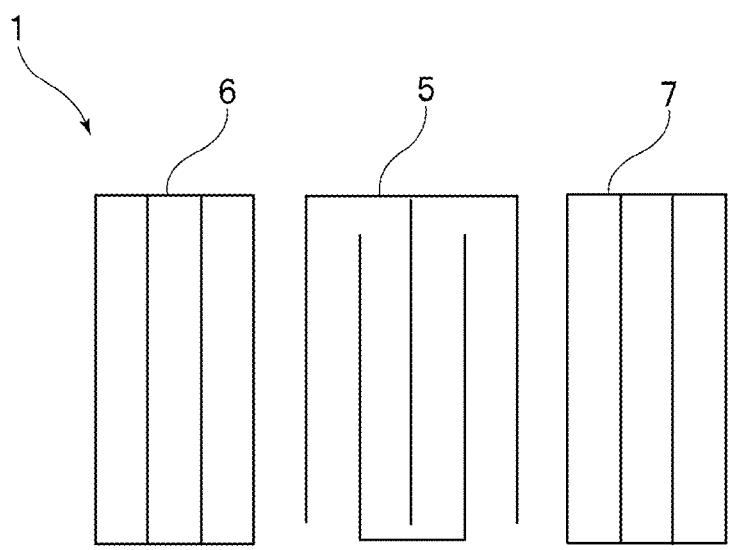
FIG. 1B is a schematic plan view that shows the electrode structure of the acoustic wave device in the first preferred embodiment of the present invention.

The piezoelectric body 4 is preferably lithium tantalate, for example. Lithium tantalate is, for example, $LiTaO_3$. Alternatively, lithium niobate, such as $LiNbO_3$, may be used as the piezoelectric body. Alternatively, another piezoelectric monocrystal, piezoelectric ceramics, or the like, may be used as the piezoelectric body. The piezoelectric body 4 is provided indirectly on the support substrate 2 via the above-described low acoustic velocity film 3. The piezoelectric body 4 includes a pair of main surfaces facing each other. An interdigital transducer electrode 5 and reflectors 6, 7 are provided on one of the main surfaces of the piezoelectric body 4. As shown in FIG. 1B, the electrode structure of the acoustic wave device 1 includes the interdigital transducer electrode 5 and the reflectors 6, 7. The acoustic wave device 1 is preferably, for example, a one-port acoustic wave resonator.

The interdigital transducer electrode 5 just needs to be provided directly or indirectly on at least one of the main surfaces of the piezoelectric body 4. In the present preferred embodiment, the interdigital transducer electrode 5 is provided on a top surface that is one of the main surfaces of the piezoelectric body 4. Alternatively, the interdigital transducer electrode 5 may be provided on a bottom surface that is the other one of the main surfaces.

As in the case of the present preferred embodiment, the interdigital transducer electrode 5 may be provided directly on the top surface of the piezoelectric body 4. Alternatively, the interdigital transducer electrode 5 may be provided indirectly via a dielectric film, or the like. A dielectric film may be provided on the interdigital transducer electrode 5.

The acoustic velocity of bulk waves that propagate in the support substrate 2 varies depending on the crystal orientation of the support substrate made of silicon. Variations in the frequency positions of higher modes that propagate in the support substrate 2 were discovered by the inventor of preferred embodiments of the present invention for the first time. The present invention is based on this new discovery.

The acoustic velocity $V_{Si}$ of bulk waves that propagate in the support substrate is expressed by the following mathematical expressions (1) to (4C) and varies depending on the values of the crystal orientation ($\phi$, $\theta$, $\psi$) of the support substrate made of silicon.

$$V_{Si} = (V_1)^{1/2} \text{(m/s)} \qquad \text{expression (1)}$$

In the mathematical expression (1), $V_1$ is a solution to the following mathematical expression (2).

$$Ax^3 + Bx^2 + Cx + D = 0 \qquad \text{expression (2)}$$

In the mathematical expression (2), A, B, C, and D are respectively values expressed by the following mathematical expressions (2A) to (2D).

$$A = -\rho^3 \quad \text{expression (2A)}$$

$$B = \rho^2(L_{11} + L_{22} + L_{33}) \quad \text{expression (2B)}$$

$$C = \rho(L_{21}^2 + L_{23}^2 + L_{31}^2 - L_{11} \cdot L_{33} - L_{22} \cdot L_{33} - L_{11} \cdot L_{22}) \quad \text{expression (2C)}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \quad \text{expression (2D)}$$

In the mathematical expression (2A), the mathematical expression (2B), the mathematical expression (2C), or the mathematical expression (2D), $\rho$ is about 2.331 (g/cm³) that is the density of silicon. $L_{11}$, $L_{22}$, $L_{33}$, $L_{21}$, $L_{31}$, and $L_{23}$ are values expressed by the following mathematical expressions (3A) to (3F).

$$L_{11} = c_{11} \cdot a_1^2 + c_{44} \cdot a_2^2 + c_{44} \cdot a_3^2 \quad \text{expression (3A)}$$

$$L_{22} = c_{44} \cdot a_1^2 + c_{11} \cdot a_2^2 + c_{44} \cdot a_3^2 \quad \text{expression (3B)}$$

$$L_{33} = c_{44} \cdot a_1^2 + c_{44} \cdot a_2^2 + c_{11} \cdot a_3^2 \quad \text{expression (3C)}$$

$$L_{21} = (c_{12} + c_{44}) \cdot a_2 \cdot a_1 \quad \text{expression (3D)}$$

$$L_{31} = (c_{12} + c_{44}) \cdot a_1 \cdot a_3 \quad \text{expression (3E)}$$

$$L_{23} = (c_{44} + c_{12}) \cdot a_3 \cdot a_2 \quad (3F)$$

In the mathematical expressions (3A) to (3F), $c_{11}$, $c_{12}$, and $c_{44}$ are elastic constants (N/m²) of silicon, and $c_{11}$ is about 1.674E+11 (N/m²), $c_{12}$ is about 6.523E+10 (N/m²), and $c_{44}$ is about 7.957E+10 (N/m²), $a_1$, $a_2$, and $a_3$ are values expressed by the following mathematical expressions (4A) to (4C).

$$a_1 = \cos(\phi) \cdot \cos(\psi) - \sin(\phi) \cdot \cos(\theta) \cdot \sin(\psi) \quad \text{expression (4A)}$$

$$a_2 = \sin(\phi) \cdot \cos(\psi) + \cos(\phi) \cdot \cos(\theta) \cdot \sin(\psi) \quad \text{expression (4B)}$$

$$a_3 = \sin(\theta) \cdot \sin(\psi) \quad \text{expression (4C)}$$

$\phi$, $\theta$, and $\psi$ in the mathematical expressions (4A) to (4C) are $\phi$, $\theta$, and $\psi$ in a crystal orientation ($\phi$, $\theta$, $\psi$) of the support substrate made of silicon.

Characteristics of the acoustic wave device 1 of the present preferred embodiment are such that, in the acoustic wave device including a support substrate made of silicon, a piezoelectric body provided directly or indirectly on the support substrate, the piezoelectric body including a pair of main surfaces facing each other, and an interdigital transducer electrode provided directly or indirectly on at least one of the main surfaces of the piezoelectric body, a wave length that is determined by an electrode finger pitch is $\lambda$, the acoustic velocity $V_{Si}$ in the mathematical expression (1) is preferably higher than or equal to about 5500 m/s, for example. Thus, as will be described below, variations in frequencies at which higher modes occur are reduced. Therefore, the response of higher mode hardly occurs at undesirable frequency positions.

When the acoustic wave device is used as a filter, spurious waves can occur on a higher frequency side outside a pass band of the acoustic wave device. For this reason, there may be a problem, such as an adverse influence on another filter, or the like, having a pass band on a higher frequency side outside the pass band. Particularly, with a structure in which a low acoustic velocity material layer and a high acoustic velocity material layer are laminated between a piezoelectric body and a support substrate or a structure in which a low acoustic velocity material layer is laminated between a piezoelectric body and a support substrate made of a high acoustic velocity material, the influence of higher modes is problematic.

In contrast to this, when the acoustic wave device 1 is used as a lower frequency-side filter in a multiplexer, spurious waves hardly occur on a higher frequency side outside the pass band of the acoustic wave device 1. Therefore, deterioration of characteristics of a higher frequency-side filter hardly occurs.

Further characteristics of the acoustic wave device 1 are such that, when, out of the solutions $V_1$, $V_2$, $V_3$ ($V_1 \leq V_2 < V_3$) of x that satisfies the mathematical expression (2), the smallest solution is $V_1$, an acoustic velocity $V_{Si}$ of slow transversal waves that propagate in the support substrate made of silicon where the acoustic velocity $V_{Si}$ is expressed by $V_{Si} = (V_1)^{1/2}$ is preferably higher than or equal to about 5500 m/s, for example.

With this configuration, the response of higher modes is further effectively reduced or prevented. When $(V_2)^{1/2}$ is higher than or equal to about 5500 m/s, the occurrence of higher modes is further reduced or prevented, so it is more preferable. Furthermore, when $(V_3)^{1/2}$ is higher than or equal to about 5500 m/s, the occurrence of higher modes is further reduced or prevented, so it is more preferable.

Figure 2:
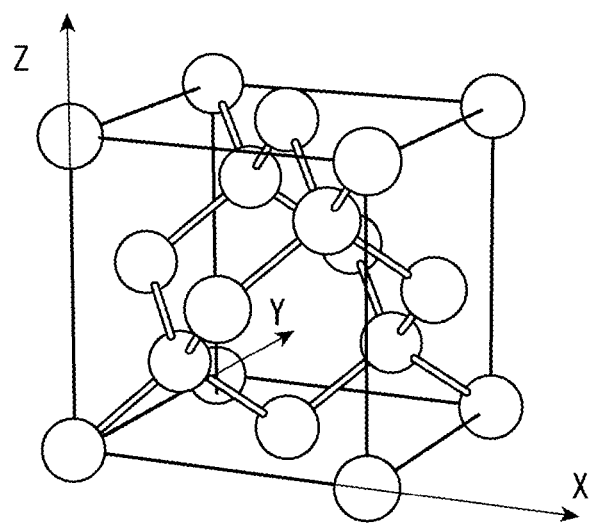
FIG. 2 is a schematic diagram for illustrating the definition of the crystal orientation of a support substrate made of silicon.

The crystal orientation ($\phi$, $\theta$, $\psi$) of the support substrate made of silicon will be described with reference to FIG. 2. FIG. 2 is a schematic diagram for illustrating the definition of the crystal orientation of the support substrate made of silicon. In the crystal structure of the support substrate made of silicon in FIG. 2, when the rotation direction of a right-hand thread is positive, Z-X-Z is used as a rotation axis. The crystal orientation ($\phi$, $\theta$, $\psi$) is an orientation as follows. 1) (X, Y, Z) is rotated by $\phi$ around the Z-axis into ($X_1$, $Y_1$, $Z_1$), subsequently, 2) ($X_1$, $Y_1$, $Z_1$) is rotated by $\theta$ around the $X_1$-axis into ($X_2$, $Y_2$, $Z_2$), and then 3) ($X_2$, $Y_2$, $Z_2$) is rotated by $\psi$ around the $Z_2$-axis into ($X_3$, $Y_3$, $Z_3$).

Figure 3:
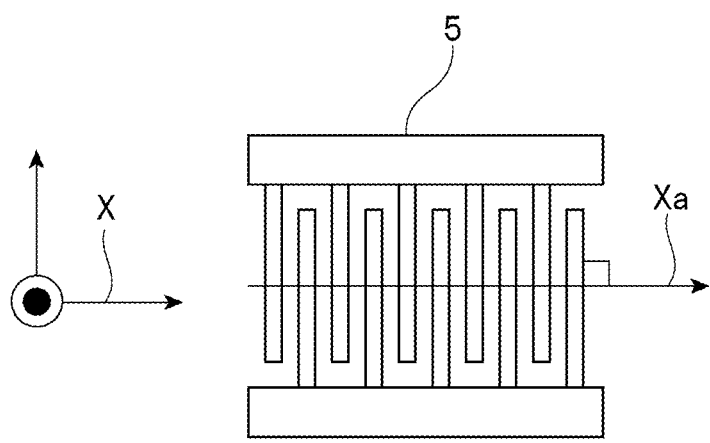
FIG. 3 is a schematic plan view that shows the relationship between the X-axis of the crystal of the support substrate made of silicon when the crystal orientation ($\phi$, $\theta$, $\psi$) of the support substrate is (0°, 0°, 0°) and a direction in which electrode fingers of an interdigital transducer electrode extend.

As shown in FIG. 3, in the acoustic wave device 1, when ($\phi$, $\theta$, $\psi$) = (0°, 0°, 0°), the X-axis of silicon crystal and a direction Xa perpendicular or substantially perpendicular to a direction in which the electrode fingers of the interdigital transducer electrode 5 extend are the same direction.

Here, $V_{Si}$ is calculated as the acoustic velocity of slow transversal waves within bulk waves that propagate in the support substrate in the Xa direction.

When the acoustic velocity $V_{Si}$ is calculated using the mathematical expression (1) where the crystal orientation of silicon in use is, for example, ($\phi$, $\theta$, $\psi$) = (0°, 0°, 0°), the acoustic velocity $V_{Si}$ is about 5843 (m/s).

The elastic constants $c_{11}$, $c_{12}$, and $c_{44}$ of silicon are values defined as follows.

A strain S and stress T of an elastic body are in a proportionality relationship. This proportionality relationship is expressed by the following matrix.

$$\begin{bmatrix} T_1 \\ T_2 \\ T_3 \\ T_4 \\ T_5 \\ T_6 \end{bmatrix} = \begin{bmatrix} c_{11} & c_{12} & c_{13} & c_{14} & c_{15} & c_{16} \\ c_{21} & c_{22} & c_{23} & c_{24} & c_{25} & c_{26} \\ c_{31} & c_{32} & c_{33} & c_{34} & c_{35} & c_{36} \\ c_{41} & c_{42} & c_{43} & c_{44} & c_{45} & c_{46} \\ c_{51} & c_{52} & c_{53} & c_{54} & c_{55} & c_{56} \\ c_{61} & c_{62} & c_{63} & c_{64} & c_{65} & c_{66} \end{bmatrix} \begin{bmatrix} S_1 \\ S_2 \\ S_3 \\ S_4 \\ S_5 \\ S_6 \end{bmatrix}$$

Proportionality constants ($c_{ij}$) of this mathematical expression are referred to as elastic constants. The elastic constants $c_{ij}$ are determined depending on a crystal system to which a solid belongs. For example, silicon may be expressed by the following three independent values from the symmetry of crystal. The elastic constants (N/m²) of silicon $$\begin{bmatrix} c_{11} & c_{12} & c_{12} & 0 & 0 & 0 \\ c_{12} & c_{11} & c_{12} & 0 & 0 & 0 \\ c_{12} & c_{12} & c_{11} & 0 & 0 & 0 \\ 0 & 0 & 0 & c_{44} & 0 & 0 \\ 0 & 0 & 0 & 0 & c_{44} & 0 \\ 0 & 0 & 0 & 0 & 0 & c_{44} \end{bmatrix}$$

The above-described elastic constants $c_{11}$, $c_{12}$, $c_{44}$ are the elastic constants of silicon defined as follows. The elastic constants of silicon are $c_{11}$=1.674E+11 (N/m²), $c_{12}$=6.523E+10 (N/m²), and $c_{44}$=7.957E+10 (N/m²) (H. J. McSkimin, et al., "Measurement of the Elastic Constants of Silicon Single Crystals and Their Thermal Constants", Phys. Rev. Vol. 83, p. 1080(L) (1951)). The density ρ of silicon is about 2.331 (g/cm³).

Hereinafter, in the acoustic wave device 1 according to the first preferred embodiment of the present invention, the fact that a frequency position at which a higher mode occurs can be stabilized will be described.

Figure 4:
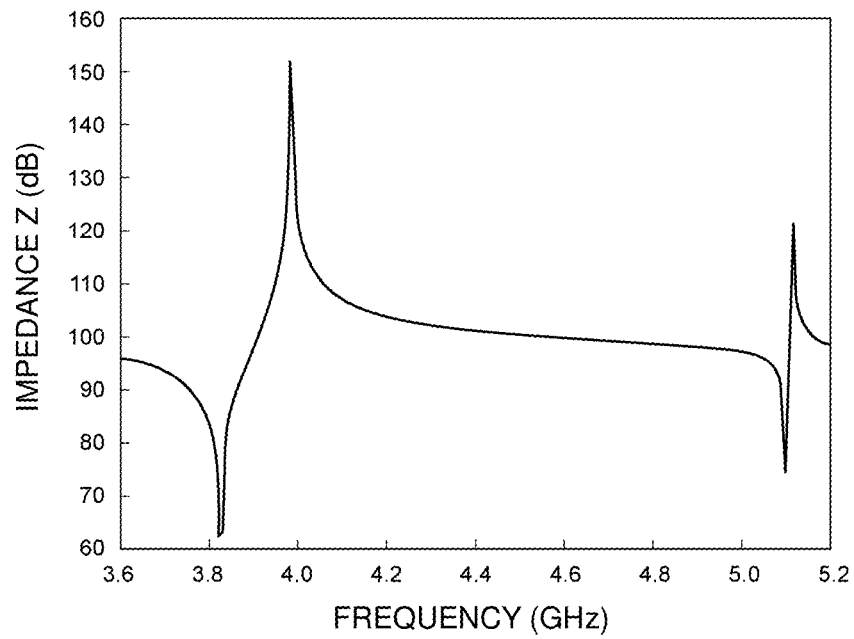
FIG. 4 is a graph that shows the resonant characteristics of the acoustic wave device of the first preferred embodiment of the present invention.

FIG. 4 is a graph that shows the resonant characteristics of the acoustic wave device according to the first preferred embodiment. The design parameters of the acoustic wave device 1 are as follows.

The crystal orientation (φ, θ, ψ) of the support substrate 2 is set to (0°, 0°, 0°).

The film thickness of the low acoustic velocity film 3 is preferably set to about 0.35λ, for example. λ is a wave length that is determined by the electrode finger pitch of the interdigital transducer electrode 5.

The thickness of the piezoelectric body 4 is preferably set to about 0.30λ, for example.

The interdigital transducer electrode 5 and the reflectors 6, 7 are preferably made from an Al film having a thickness of about 0.08λ, for example. Calculations are performed with a wave length λ of about 1 µm.

With the above design parameters, a one-port acoustic wave resonator having a fractional band width in an acoustic velocity 3900 m/s band is designed as the acoustic wave device 1.

As shown in FIG. 4, in the acoustic velocity 3900 m/s band, the response of a fundamental mode appears. On the other hand, in a 5100 m/s band, the response of a higher mode appears.

Figure 5:
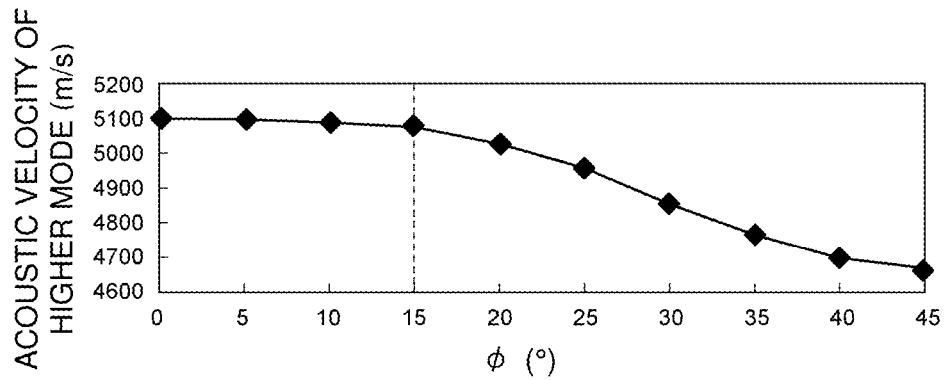
FIG. 5 is a graph that shows the relationship between θ of the crystal orientation ($\phi$, 0°, 0°) of the support substrate and the acoustic velocity of a higher mode in a structure in which a silicon oxide film and a piezoelectric body are laminated on the support substrate made of silicon.

FIG. 5 is a graph that shows a change in the acoustic velocity of a higher mode that propagates through the support substrate when φ in the crystal orientation (φ, 0°, 0°) of the support substrate 2 made of silicon is changed. As is apparent from FIG. 5, when φ falls within the range greater than or equal to about 0° and less than or equal to about 15°, a change in the acoustic velocity of the higher mode is small even when φ changes. In other words, it is preferable that φ falls within the range greater than or equal to about 0° and less than or equal to about 15°, for example. With this configuration, the acoustic velocity of the higher mode is stabilized.

Figure 6:
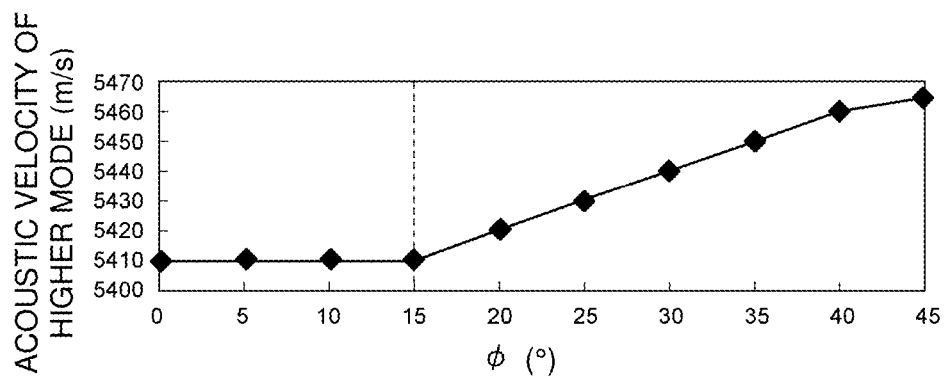
FIG. 6 is a graph that shows the relationship between $\phi$ of the crystal orientation ($\phi$, 0°, 0°) of the support substrate and the acoustic velocity of a higher mode in a structure in which a piezoelectric body is laminated on the support substrate made of silicon.

On the other hand, FIG. 6 is a graph that shows the relationship between φ and the acoustic velocity of a higher mode in the same structure as the above-described structure except for the fact that the low acoustic velocity film 3 is removed. In the structure in which the piezoelectric body is directly laminated on the support substrate made of silicon, it appears that, as shown in FIG. 6, the acoustic velocity of the higher mode is stabilized when φ falls within the range greater than or equal to about 0° and less than or equal to about 15°. Therefore, in the structure in which the piezoelectric body is directly laminated on the support substrate made of silicon as well, it is preferable that φ is greater than or equal to about 0° and less than or equal to about 15°, for example.

Figure 7:
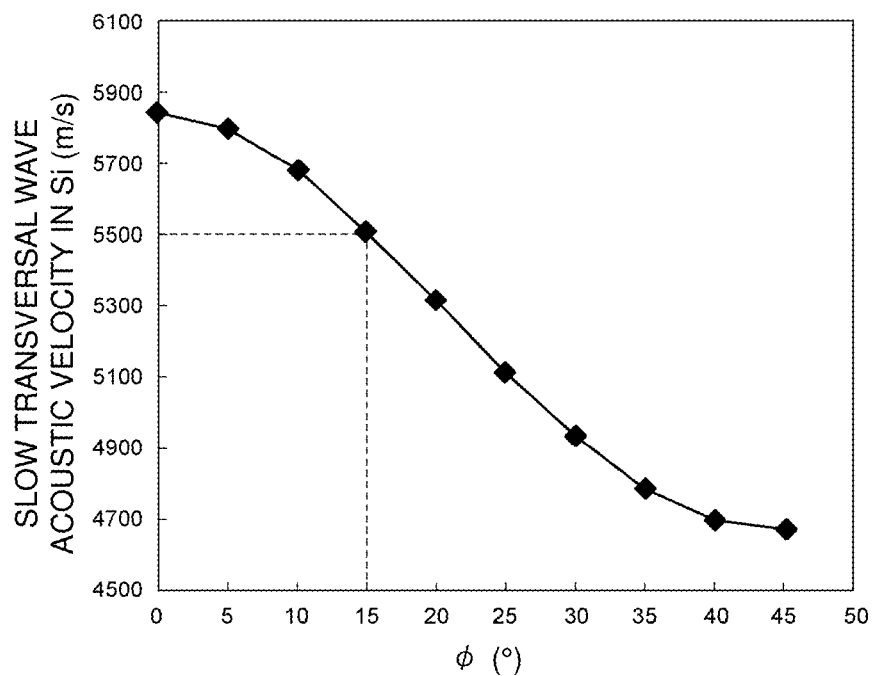
FIG. 7 is a graph that shows the relationship between $\phi$ of the crystal orientation ($\phi$, 0°, 0°) of the support substrate and made of silicon and the acoustic velocity of slow transversal waves that propagate through the support substrate.

FIG. 7 is a graph that shows the relationship between φ in the crystal orientation (φ, 0°, 0°) of the support substrate made of silicon and the acoustic velocity of the slowest transversal waves among the acoustic velocities of bulk waves that propagate in the support substrate. As is apparent from FIG. 7, when φ=15°, the acoustic velocity of the slowest transversal waves among the acoustic velocities of bulk waves that propagate in the support substrate is about 5500 m/s. Therefore, to set φ to less than or equal to about 15°, it is discovered that the acoustic velocity of the slowest transversal waves among the acoustic velocities of bulk waves that propagate in the support substrate just needs to be higher than or equal to about 5500 m/s.

When φ=0°, the acoustic velocity of the slowest transversal waves among the acoustic velocities of bulk waves that propagate in the support substrate is about 5843 m/s. Therefore, the acoustic velocity of the slow transversal waves is preferably set to higher than or equal to about 5500 m/s and lower than or equal to about 5843 m/s, for example. With this configuration, the frequency position of the higher mode can be further effectively stabilized.

Figure 8:
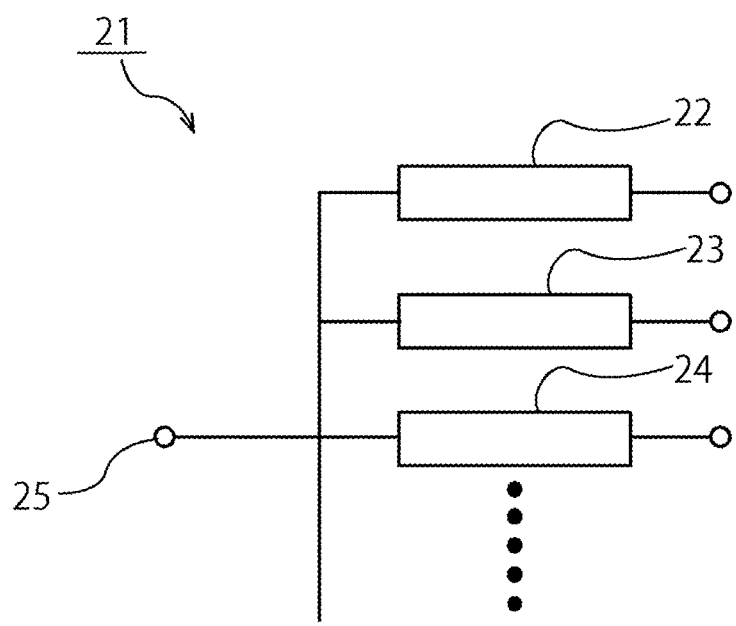
FIG. 8 is a circuit diagram for illustrating an example of a multiplexer according to a preferred embodiment of the present invention.

FIG. 8 is a circuit diagram for illustrating an example of a multiplexer according to a preferred embodiment of the present invention. In the multiplexer 21, one ends of first to third band pass filters 22 to 24 are connected in common. In an RF stage, or the like, of a cellular phone, such the multiplexer 21 is connected in common to an antenna terminal 25.

Pass bands of the first band pass filter 22, second band pass filter 23, and third band pass filter 24 are different from one another. The pass band of the first band pass filter 22 is denoted as pass band A. The pass band of the second band pass filter 23 is denoted as pass band B. It is assumed that the pass band A lies in a frequency range lower than the pass band B. In other words, A<B.

In the multiplexer 21, the pass band A is preferably set to the range of about 1850 MHz to about 1915 MHz, and the pass band B is preferably set to the range of about 2300 MHz to about 2400 MHz, for example. In the multiplexer 21 according to the present preferred embodiment of the present invention, the acoustic velocity $V_{Si}$ that is the acoustic velocity of the slow transversal waves that propagate through the support substrate made of silicon is preferably set to about 5843 m/s, for example. In this case, the frequency position at which a higher mode occurs is about 2461 MHz.

In the multiplexer 21, the first band pass filter 22 is provided by using the acoustic wave device 1 of the first preferred embodiment. The circuit configuration of the first band pass filter 22 is not specifically limited. Here, a ladder filter including a plurality of the acoustic wave devices 1 is preferably provided as the circuit configuration of the first band pass filter 22. In other words, devices having a similar structure to that of the acoustic wave device 1 of the first preferred embodiment are preferably used as each of series arm resonator(s) and parallel arm resonator(s) of the ladder filter.

For comparison, a multiplexer is configured such that, in a first band pass filter, each of series arm resonator(s) and parallel arm resonator(s) is configured as in the case of the above-described multiplexer, except for the fact that the acoustic velocity $V_{Si}$ that is the acoustic velocity of the slowest transversal waves among the acoustic velocities of bulk waves that propagate in the support substrate is set to about 4681 m/s.

Figure 9:
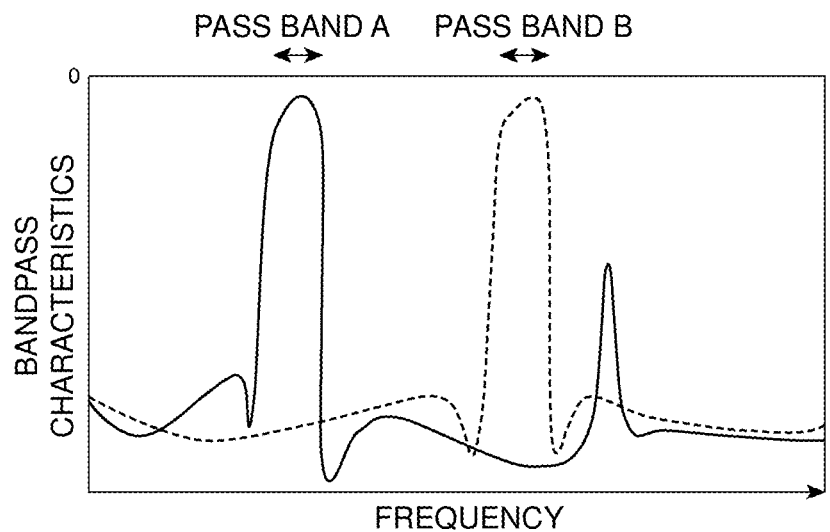
FIG. 9 is a graph that shows the bandpass characteristics of a first band pass filter and the bandpass characteristics of a second band pass filter.
Figure 10:
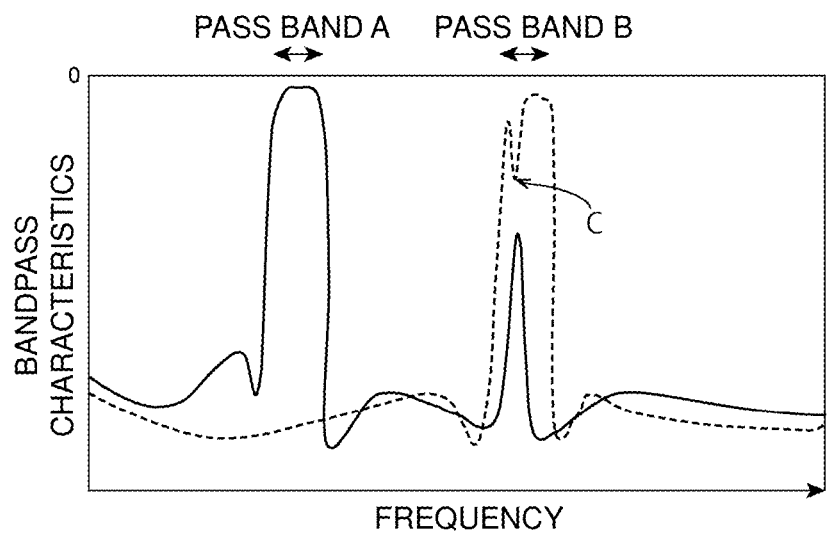
FIG. 10 is a graph that shows the bandpass characteristics of a first band pass filter and the bandpass characteristics of a second band pass filter in a comparative example.

FIG. 9 is a graph that shows the bandpass characteristics of the first band pass filter 22 and the bandpass characteristics of the second band pass filter 23 in the present preferred embodiment of the multiplexer of the present invention. FIG. 10 shows the bandpass characteristics of the first band pass filter and the bandpass characteristics of the second band pass filter in the comparative example. In FIG. 9 and FIG. 10, the continuous lines represent the bandpass characteristics of the first band pass filter. The dashed lines represent the bandpass characteristics of the second band pass filter.

As is apparent from FIG. 10, in the comparative example, a large ripple represented by the arrow C appears in the pass band in the bandpass characteristics of the second band pass filter. That is, an insertion loss in the pass band is significantly deteriorated. This is presumably deterioration due to a higher mode of the acoustic wave device that is used in the first band pass filter.

In contrast to this, in FIG. 9, no such a ripple appears in the pass band B in the bandpass characteristics of the second band pass filter. With the acoustic wave device 1 that is used in the first band pass filter 22, the frequency position of the response of a higher mode lies outside the pass band B. Therefore, the characteristics in the pass band B of the second band pass filter 23 are not influenced.

A frequency at which a higher mode occurs is an important item in designing a multiplexer. For this reason, a stable frequency position at which a higher mode occurs is desired. On the other hand, as described above, a frequency at which a higher mode occurs is considerably stabilized when the acoustic velocity of the lowest transversal waves among the acoustic velocities of bulk waves that propagate in the support substrate is set to higher than or equal to about 5500 m/s. Therefore, with the above-described acoustic wave device 1, in the multiplexer 21, the frequency position at which a higher mode occurs in the acoustic wave devices that are used in the first band pass filter 22 is easily stabilized. In addition, reliably bringing the frequency position at which a higher mode occurs out of the pass band B of the second band pass filter 23 is facilitated.

In other words, an example in which a higher mode that is generated by the filter that provides the pass band A appears outside the pass band B is shown in FIG. 9. In this case, since an attenuation in the pass band A is sufficiently large in the pass band B, almost all required radio-frequency signals can be caused to pass in the pass band B. On the other hand, when a higher mode that is generated by the filter that provides the pass band A overlaps the pass band B as shown in FIG. 10, a portion of required radio-frequency signals flows to the filter that provides the pass band A. As a result, in the filter that provides the pass band B, a loss occurs at the same frequency position as the higher mode, and filter characteristics deteriorate.

When the acoustic velocity of the slowest transversal waves among the acoustic velocities of bulk waves that propagate in the support substrate is higher than or equal to about 5500 m/s, the reason why the frequency position at which a higher mode occurs becomes stable is presumably as follows.

Figure 11:
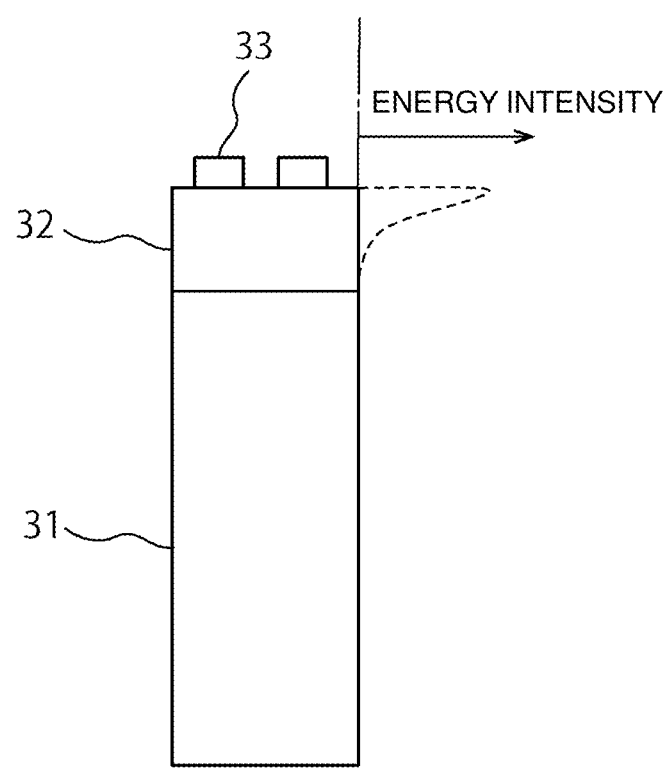
FIG. 11 is a view that shows the energy distribution of a higher mode when, of the acoustic velocities of bulk waves that propagate in a support substrate made of silicon, the acoustic velocity of the slowest transversal waves is higher than or equal to about 5500 m/s in the structure in which a piezoelectric body is laminated on the support substrate.

FIG. 11 is a view that shows the energy distribution of a higher mode when, of the acoustic velocities of bulk waves that propagate in a support substrate 31, the acoustic velocity of the slowest transversal waves is higher than or equal to about 5500 m/s in the structure in which a piezoelectric body 32 is laminated on the support substrate 31 made of silicon. On the other hand, FIG. 12 is a view that shows the energy distribution of a higher mode when, of the acoustic velocities of bulk waves that propagate in a support substrate, the acoustic velocity of the slowest transversal waves is lower than about 5500 m/s in the structure in which a piezoelectric body is laminated on the support substrate made of silicon.

Figure 12:
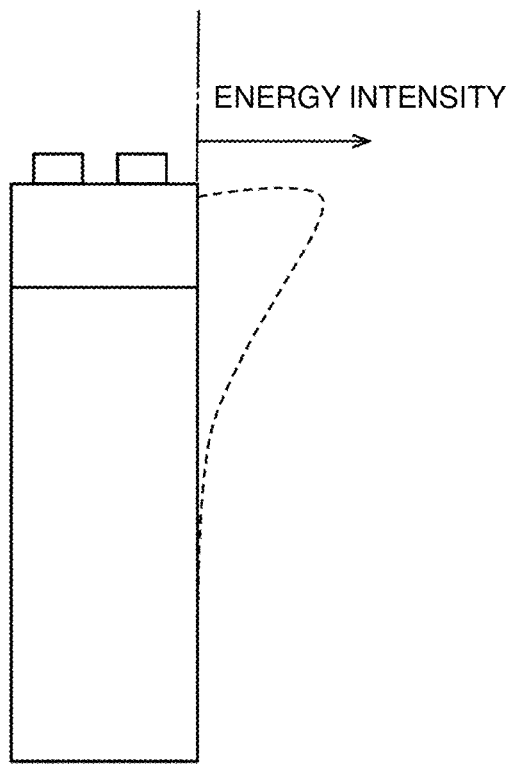
FIG. 12 is a view that shows the energy distribution of a higher mode when, of the acoustic velocities of bulk waves that propagate in a support substrate made of silicon, the acoustic velocity of the slowest transversal waves is lower than about 5500 m/s in the structure in which a piezoelectric body is laminated on the support substrate.

In FIG. 11 and FIG. 12, the dashed lines represent the energy intensity of a higher mode.

As is apparent from FIG. 11, when the acoustic velocity of the slowest transversal waves among the acoustic velocities of bulk waves that propagate in the support substrate 31 is higher than or equal to about 5500 m/s, a higher mode is enclosed in a portion above the support substrate 31. In other words, a higher mode is enclosed in the piezoelectric body 32. Therefore, almost no higher mode propagates into the support substrate 31. Thus, a higher mode is hardly influenced by the acoustic velocity of the slowest transversal waves among the acoustic velocities of bulk waves that propagate in the support substrate 31.

In contrast to this, as shown in FIG. 12, when the acoustic velocity of the slowest transversal waves among the acoustic velocities of bulk waves that propagate in the support substrate is lower than about 5500 m/s, a higher mode propagates at a considerable energy intensity not only in the piezoelectric body but also in the support substrate. For this reason, the frequency position at which a higher mode occurs is significantly influenced by a change in the acoustic velocity of the slowest transversal waves among the acoustic velocities of bulk waves that propagate in the support substrate.

As described above, when the acoustic velocity of the slowest transversal waves among the acoustic velocities of bulk waves that propagate in the support substrate is higher than or equal to about 5500 m/s, a change in the frequency position of a higher mode due to a change in the acoustic velocity of the slow transversal waves is effectively reduced or prevented.

Figure 13:
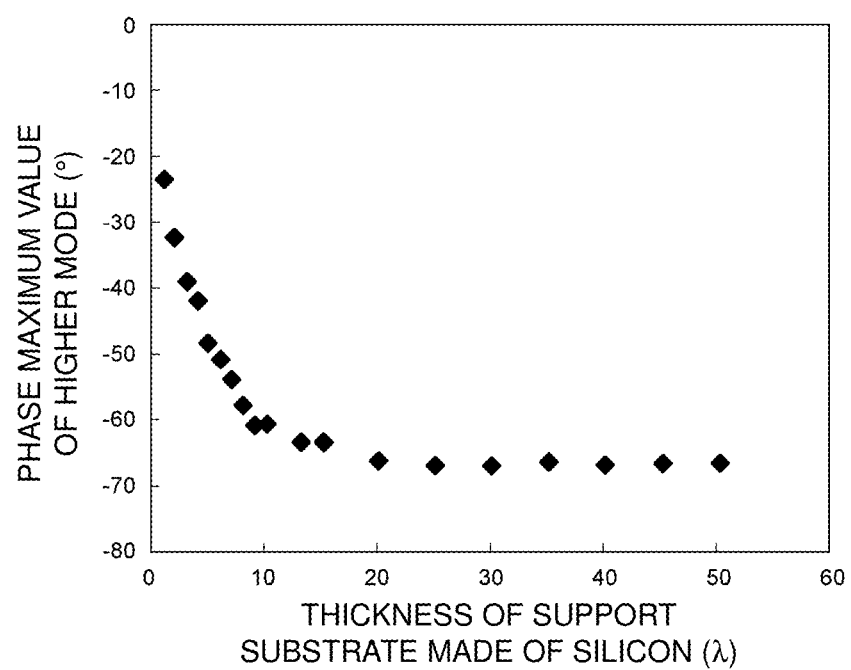
FIG. 13 is a graph that shows the relationship between the thickness of the support substrate made of silicon and the phase maximum value (degree) of the higher mode.

FIG. 13 is a graph that shows the relationship between the thickness of the support substrate made of silicon and the phase maximum value of a higher mode in the acoustic wave device of the first preferred embodiment.

The peak of a higher mode, that is, the phase maximum value of a higher mode, is a value represented by the ordinate axis in FIG. 13.

As is apparent from FIG. 13, when the thickness of the support substrate is greater than or equal to about 10λ, the phase maximum value of a higher mode is reduced. In addition, even when the thickness of the support substrate increases, the phase maximum value of a higher mode is substantially constant. Therefore, to reduce or prevent the intensity of a higher mode, it is preferable that the thickness of the support substrate 2 is greater than or equal to about 10λ, for example.

When the thickness of the support substrate 2 is excessive, the heat radiation property decreases or the low profile becomes difficult. Therefore, in reducing or preventing a higher mode, although not specifically limited, an upper limit of the thickness of the support substrate 2 is preferably less than or equal to about 180 µm because of the above reason. Thus, preferably, the thickness of the support substrate 2 is greater than or equal to about 10λ and less than or equal to about 180 µm, for example. In this case, λ is less than or equal to about 18 µm.

Figure 14:
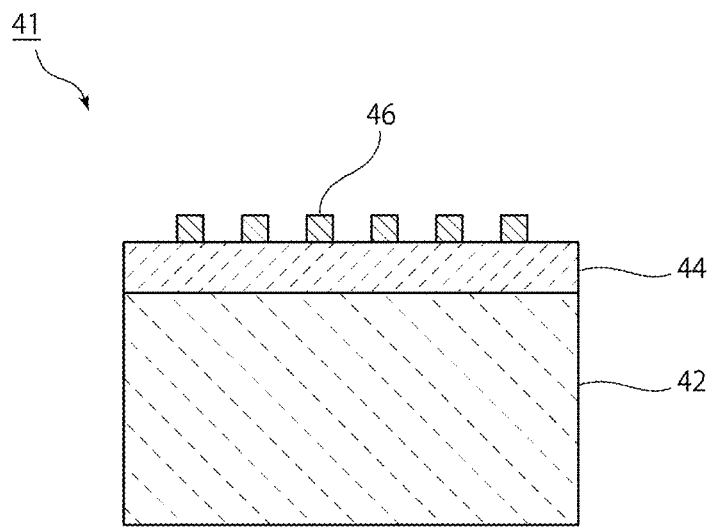
FIG. 14 is a front cross-sectional view of an acoustic wave device according to a second preferred embodiment of the present invention.

FIG. 14 is a front cross-sectional view of an acoustic wave device according to a second preferred embodiment of the present invention.

In the acoustic wave device 41, a piezoelectric body 44 and an interdigital transducer electrode 46 are laminated on a support substrate 42 made of silicon in this order. Therefore, the acoustic wave device 41 of the second preferred embodiment corresponds to a structure in which the low acoustic velocity film 3 is removed from the acoustic wave device 1 of the first preferred embodiment. In the acoustic wave device 41 of the second preferred embodiment as well, the acoustic velocity $V_{Si}$ in the mathematical expression (1), which is the acoustic velocity of bulk waves that propagate in the support substrate 42, is preferably higher than or equal to about 5500 m/s, for example. Therefore, as in the case of the acoustic wave device 1 of the first preferred embodiment, variations in the frequency position of a higher mode that propagates in the support substrate made of silicon hardly occur. As in the case of the acoustic wave device 41 of the second preferred embodiment, in the present invention, a low acoustic velocity film is not an indispensable component.

Figure 15:
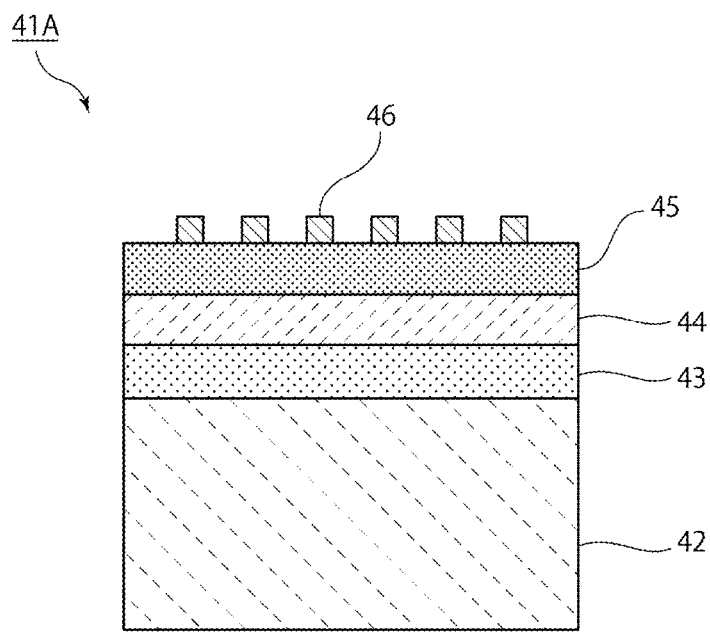
FIG. 15 is a front cross-sectional view of an acoustic wave device according to a third preferred embodiment of the present invention.

FIG. 15 is a front cross-sectional view of an acoustic wave device according to a third preferred embodiment of the present invention.

In the acoustic wave device 41A, a low acoustic velocity material layer 43, the piezoelectric body 44, a dielectric film 45 that serves as a dielectric layer, and the interdigital transducer electrode 46 are laminated on the support substrate 42 made of silicon in this order.

The low acoustic velocity material layer 43 is made of a low acoustic velocity material. The low acoustic velocity material is a material through which bulk waves propagate at an acoustic velocity lower than the acoustic velocity of acoustic waves that propagate through the piezoelectric body 44. Silicon oxide, such as $SiO_2$, or a dielectric, such as tantalum pentoxide, for example, may preferably be used as such a material.

In other words, a dielectric layer is preferably used as the low acoustic velocity material layer 43.

The piezoelectric body 44 is preferably made of $LiTaO_3$ as in the case of the first preferred embodiment. Alternatively, the piezoelectric body 44 may be made of another piezoelectric monocrystal, such as $LiNbO_3$, for example.

The interdigital transducer electrode 46 is made of an appropriate metal or alloy.

Although not shown in FIG. 15, in the acoustic wave device 41A, reflectors are preferably provided on both sides of the interdigital transducer electrode in the acoustic wave propagation direction. Thus, a one-port acoustic wave resonator is provided.

In the first to third preferred embodiments, the acoustic wave resonators are described. However, the acoustic wave device of preferred embodiments of the present invention is not limited to the acoustic wave resonators. The acoustic wave device may be a longitudinally coupled resonator acoustic wave filter or an acoustic wave device having another electrode structure.

Figure 16:
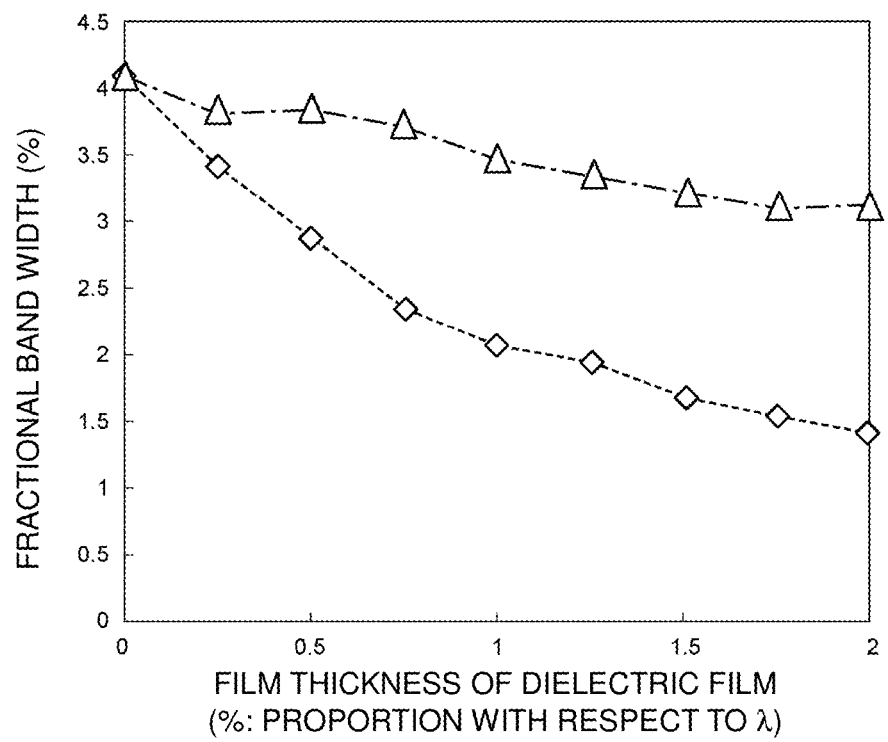
FIG. 16 is a graph that shows the relationship between the film thickness (%: proportion with respect to λ) of a dielectric film between the interdigital transducer electrode and the piezoelectric body and a fractional band width (%) in the third preferred embodiment of the present invention.

FIG. 16 is a graph that shows the relationship between the film thickness (%: proportion with respect to λ) of the dielectric film 45 between the interdigital transducer electrode 46 and the piezoelectric body 44 and a fractional band width (%) in the third preferred embodiment. λ is a wave length that is determined by the electrode finger pitch of the interdigital transducer electrode.

In FIG. 16, the triangles represent the results in the case where the dielectric film is tantalum pentoxide, and the diamonds represent the results in the case where the dielectric film is $SiO_2$.

In any case as well, it is discovered that the fractional band width can be adjusted to be narrow when the thickness of the dielectric film is increased.

The structures of acoustic wave devices and acoustic wave device packages according to fourth, fifth, sixth, and seventh preferred embodiments of the present invention will be described with reference to FIG. 17 to FIG. 20.

Figure 17:
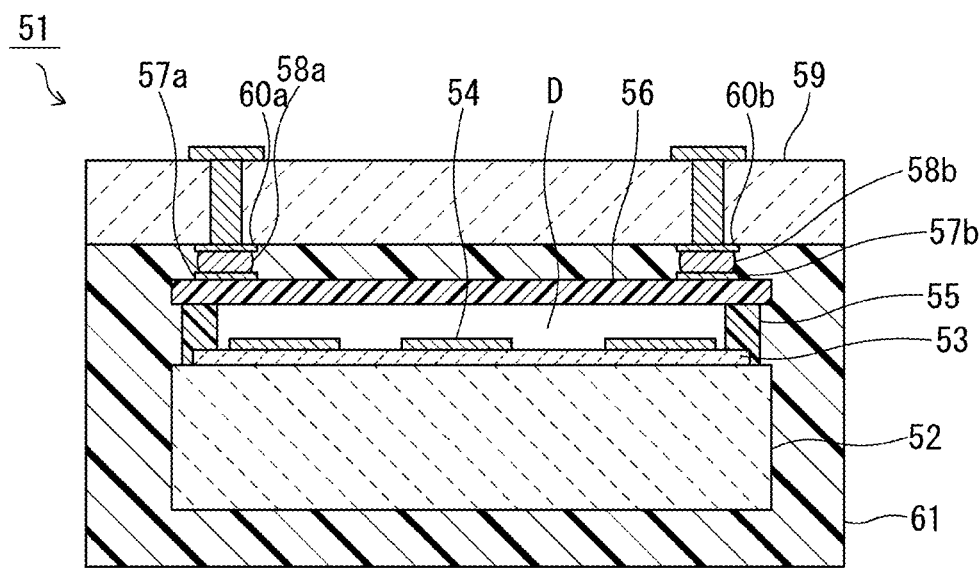
FIG. 17 is a front cross-sectional view of an acoustic wave device package according to a fourth preferred embodiment of the present invention.

As shown in FIG. 17, the acoustic wave device package 51 of the fourth preferred embodiment includes a support substrate 52 made of silicon, a piezoelectric body 53 laminated on the support substrate 52, and an interdigital transducer electrode 54 provided on the piezoelectric body 53. A support layer 55 made of a resin is provided so as to surround the interdigital transducer electrode 54. A cover member 56 is joined onto the support layer 55. Thus, a hollow space D is provided. Terminal electrodes 57a, 57b and metal bumps 58a, 58b are provided on the cover member 56. An element portion having a WLP (wafer level package) structure is a portion in which the piezoelectric body 53, the interdigital transducer electrode 54, the support layer 55, the cover member 56, the terminal electrodes 57a, 57b, and the metal bumps 58a, 58b are provided on the support substrate 52. The metal bumps 58a, 58b are electrically connected to the terminal electrodes 60a, 60b of a case substrate 59. The entire element portion having the WLP structure is sealed by a sealing resin layer 61.

Figure 18:
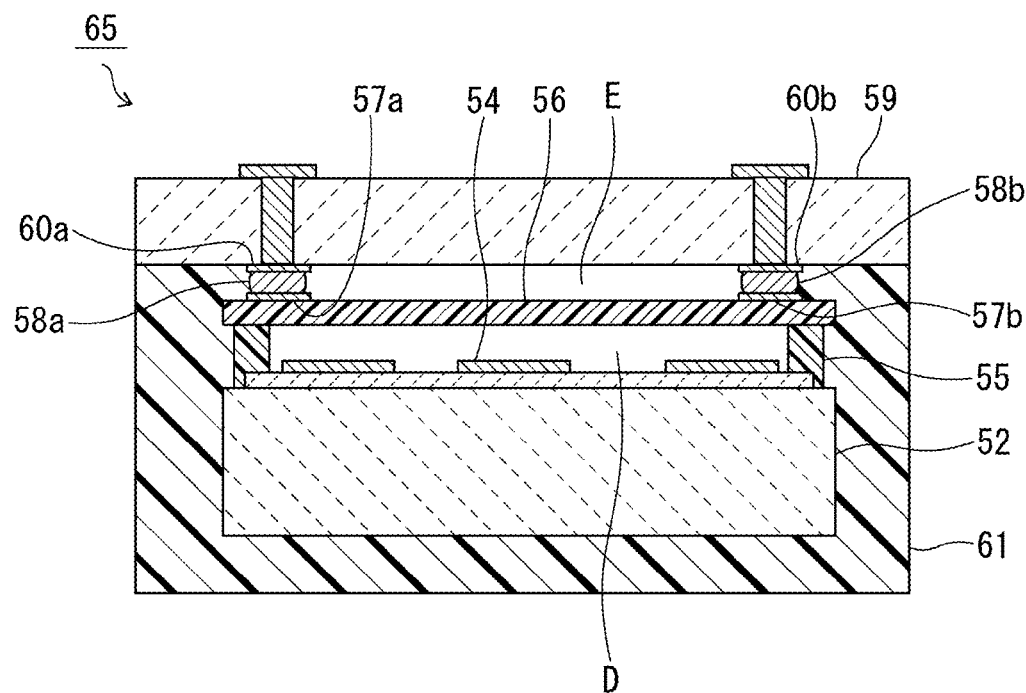
FIG. 18 is a front cross-sectional view of an acoustic wave device package according to a fifth preferred embodiment of the present invention.

In the acoustic wave device package 65 shown in FIG. 18, the sealing resin layer 61 does not extend to a space E between the metal bump 58a and the metal bump 58b. In the other points, the acoustic wave device package 65 is similar to the acoustic wave device package 51.

Figure 19:
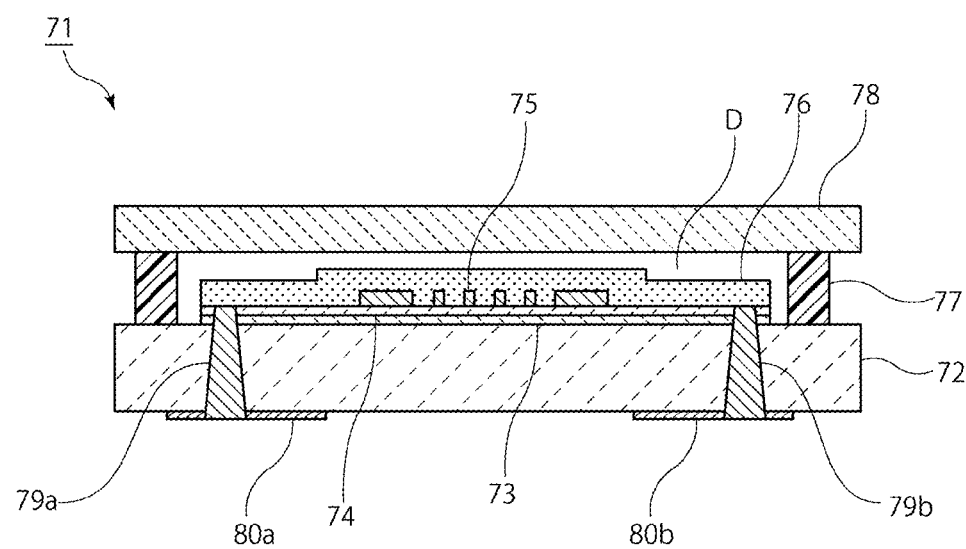
FIG. 19 is a front cross-sectional view of an acoustic wave device according to a sixth preferred embodiment of the present invention.

In an acoustic wave device 71 shown in FIG. 19, a low acoustic velocity material layer 73 and a piezoelectric body 74 are laminated on a support substrate 72 made of silicon in this order. An interdigital transducer electrode 75 is provided on the piezoelectric body 74. In preferred embodiments of the present invention, the dielectric layer 76 may be further provided so as to cover the interdigital transducer electrode 75. A dielectric material for such the dielectric layer 76 is not specifically limited. For example, silicon oxide, or the like, may preferably be used.

A support layer 77 is provided so as to surround the interdigital transducer electrode 75. A cover member 78 is joined onto the support layer 77. Thus, the hollow space D is provided. Via electrodes 79a, 79b that define and function as through vias extend through the support substrate 72, the low acoustic velocity material layer 73, and the piezoelectric body 74. The via electrodes 79a, 79b are electrically connected to the interdigital transducer electrode 75. Terminal electrodes 80a, 80b are provided on the bottom surface of the support substrate 72. The via electrodes 79a, 79b are electrically connected to the terminal electrodes 80a, 80b. In this manner, electrical connection with an external device may be provided using the via electrodes 79a, 79b that extend through the support substrate 72.

The cover member 78 is preferably made of an inorganic material. In this case, since the cover member is preferably made of an inorganic material and has a high strength, mold resistance is increased. Since the terminal electrodes are provided on a surface on an opposite side of the support substrate from a side on which the interdigital transducer electrode is provided, miniaturization is achieved as compared to when the terminal electrodes are provided on the cover member side. Particularly, when an inorganic material that defines and functions as the material of the cover member is silicon, the difference in coefficient of linear expansion between the cover member and the support substrate is small, so cracking under thermal load is reduced.

Figure 20:
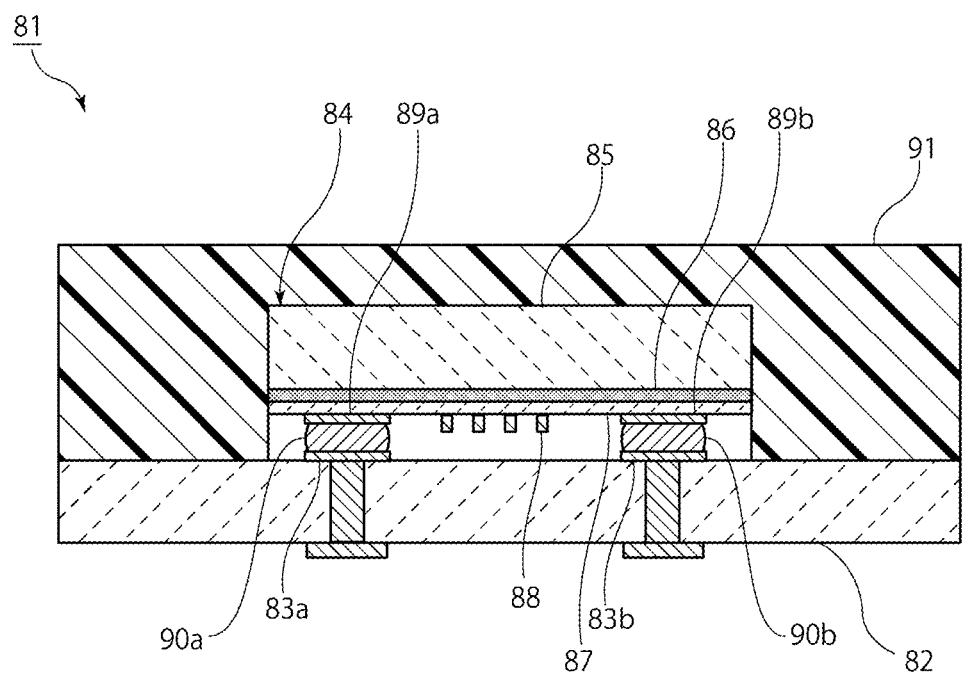
FIG. 20 is a front cross-sectional view of an acoustic wave device package according to a seventh preferred embodiment of the present invention.

As shown in FIG. 20, in an acoustic wave device package according to a seventh preferred embodiment of the present invention, terminal electrodes 83a, 83b are provided on one of the surfaces of a case substrate 82. An acoustic wave device 84 is mounted on the case substrate 82. The acoustic wave device 84 has a structure in which a low acoustic velocity material layer 86, a piezoelectric body 87, and an interdigital transducer electrode 88 are laminated on a support substrate 85 made of silicon in this order. Terminal electrodes 89a, 89b are provided on the piezoelectric body 87. Metal bumps 90a, 90b are provided on the terminal electrodes 89a, 89b. The metal bumps 90a, 90b are joined with the terminal electrodes 83a, 83b. A sealing resin layer 91 is provided so as to cover the acoustic wave device 84.

Figure 21:
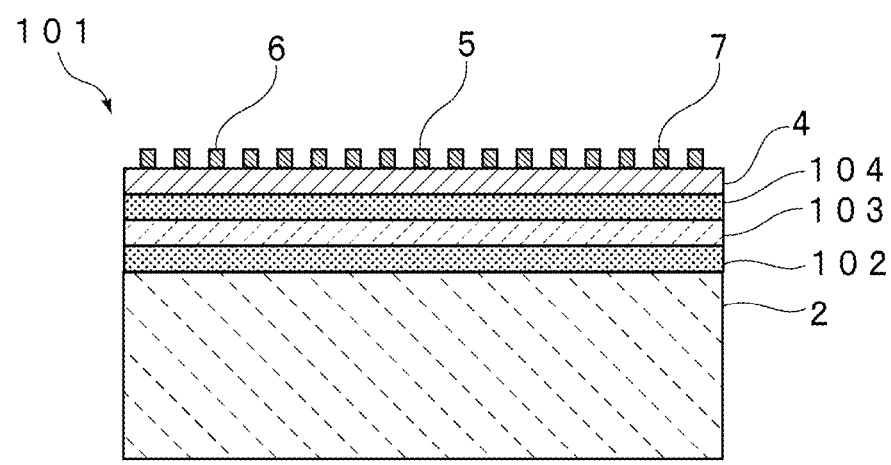
FIG. 21 is a front cross-sectional view of an acoustic wave device according to an eighth preferred embodiment of the present invention.

FIG. 21 is a front cross-sectional view of an acoustic wave device according to an eighth preferred embodiment of the present invention.

In the acoustic wave device 101, a low acoustic velocity material layer 102, a high acoustic velocity material layer 103, and a low acoustic velocity material layer 104 are laminated on the support substrate 2 made of silicon in this order. The piezoelectric body 4 is laminated on the low acoustic velocity material layer 104.

As in the case of the acoustic wave device 101, the low acoustic velocity material layers 102, 104 and the high acoustic velocity material layer 103 may be laminated between the support substrate 2 and the piezoelectric body 4. Here, the low acoustic velocity material layers 102, 104 are made of a low acoustic velocity material. The low acoustic velocity material is a material through which bulk waves propagate at an acoustic velocity lower than the acoustic velocity of acoustic waves that propagate through a piezoelectric body such as the piezoelectric body 4. The high acoustic velocity material layer 103 is made of a high acoustic velocity material. The high acoustic velocity material is a material through which bulk waves propagate at an acoustic velocity higher than the acoustic velocity of acoustic waves that propagate through a piezoelectric body such as the piezoelectric body 4. Examples of the low acoustic velocity material include a dielectric, such as silicon oxide and tantalum pentoxide. Examples of the high acoustic velocity material include, other than metals or silicon, materials, such as aluminum nitride, aluminum oxide, silicon carbide, silicon nitride, silicon oxynitride, sapphire, lithium tantalate, lithium niobate, quartz crystal, alumina, zirconia, cordierite, mullite, steatite, forsterite, magnesia, a DLC film, and diamond, a medium containing at least one of the materials as a main ingredient, and a medium containing a mixture of some of the materials as main ingredients.

Preferably, at least one low acoustic velocity material layer is disposed between the at least one high acoustic velocity material layer 103 and the piezoelectric body 4. With this configuration, acoustic waves are effectively enclosed in the piezoelectric body 4. The support substrate 2 is made of a high acoustic velocity material. Therefore, as in the case of the first preferred embodiment, the structure in which the silicon oxide film 3 is laminated on the support substrate 2 is a configuration in which a low acoustic velocity material layer is located between the support substrate 2 made of a high acoustic velocity material and the piezoelectric body 4. Therefore, with the acoustic wave device 1 as well, the energy of acoustic waves is effectively enclosed in the piezoelectric body 4.

In preferred embodiments of the present invention, another piezoelectric monocrystal film, such as an LiNbO$_3$ film, for example, may preferably be used as the piezoelectric body. A piezoelectric material other than a piezoelectric monocrystal may be used.

Figure 22:
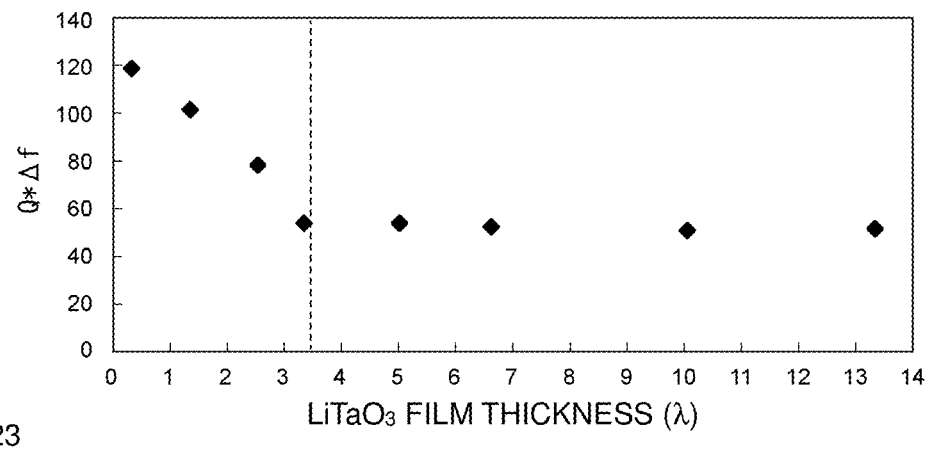
FIG. 22 is a graph that shows the relationship between the film thickness of a lithium tantalate film and quality factor in the acoustic wave device.
Figure 23:
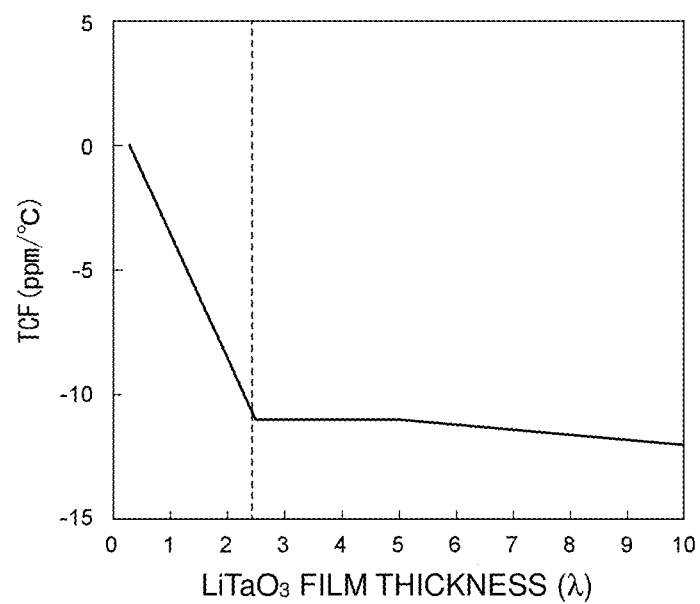
FIG. 23 is a graph that shows the relationship between the film thickness of a lithium tantalate film in the acoustic wave device and a temperature coefficient of resonant frequency (TCF).
Figure 24:
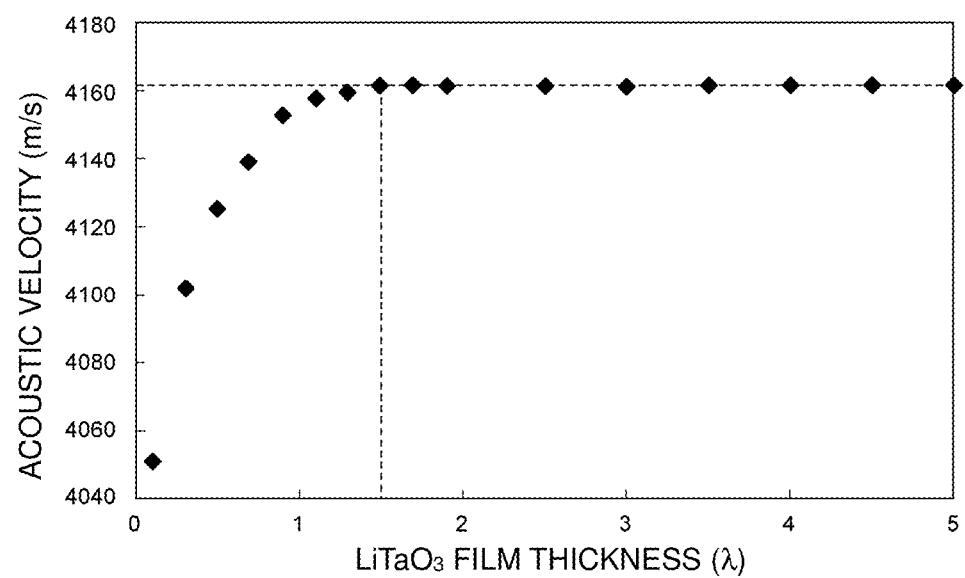
FIG. 24 is a graph that shows the relationship between the film thickness of a lithium tantalate film in the acoustic wave device and an acoustic velocity.

FIG. 22 is a graph that shows the relationship between the film thickness of an LiTaO$_3$ film and a quality factor in the acoustic wave device in which a low acoustic velocity film that defines and functions as a low acoustic velocity material layer made of an SiO$_2$ film having a thickness of about 0.35, and the LiTaO$_3$ film that defines and functions as a piezoelectric film made of lithium tantalate having Euler angles of (0°, 140.0°, 0°) are laminated on a high acoustic velocity support substrate made of silicon. The ordinate axis in FIG. 22 represents the product of the quality factor characteristics and fractional band width (Of) of a resonator. FIG. 23 is a graph that shows the relationship between the film thickness of the LiTaO$_3$ film and the temperature coefficient of resonant frequency (TCF). FIG. 24 is a graph that shows the relationship between the film thickness of the LiTaO$_3$ film and an acoustic velocity.

From FIG. 22, it is preferable that the film thickness of the LiTaO$_3$ film is less than or equal to about 3.5λ, for example. In that case, the quality factor increases as compared to the case over about 3.5λ. To further increase the quality factor, it is more preferable that the film thickness of the LiTaO$_3$ film is less than or equal to about 2.5λ, for example.

From FIG. 23, when the film thickness of the LiTaO$_3$ film is less than or equal to about 2.5λ, the absolute value of the temperature coefficient of resonant frequency (TCF) is reduced as compared to the case where the film thickness exceeds 2.5λ. More preferably, the film thickness of the LiTaO$_3$ film is less than or equal to about 2λ, for example. In this case, the absolute value of the temperature coefficient of resonant frequency (TCF) is less than or equal to about 10 ppm/° C. To reduce the absolute value of the temperature coefficient of resonant frequency (TCF), it is further preferable that the film thickness of the LiTaO$_3$ film is less than or equal to about 1.5λ, for example.

From FIG. 24, when the film thickness of the LiTaO$_3$ film exceeds 1.5λ, a change in acoustic velocity is extremely small.

Figure 25:
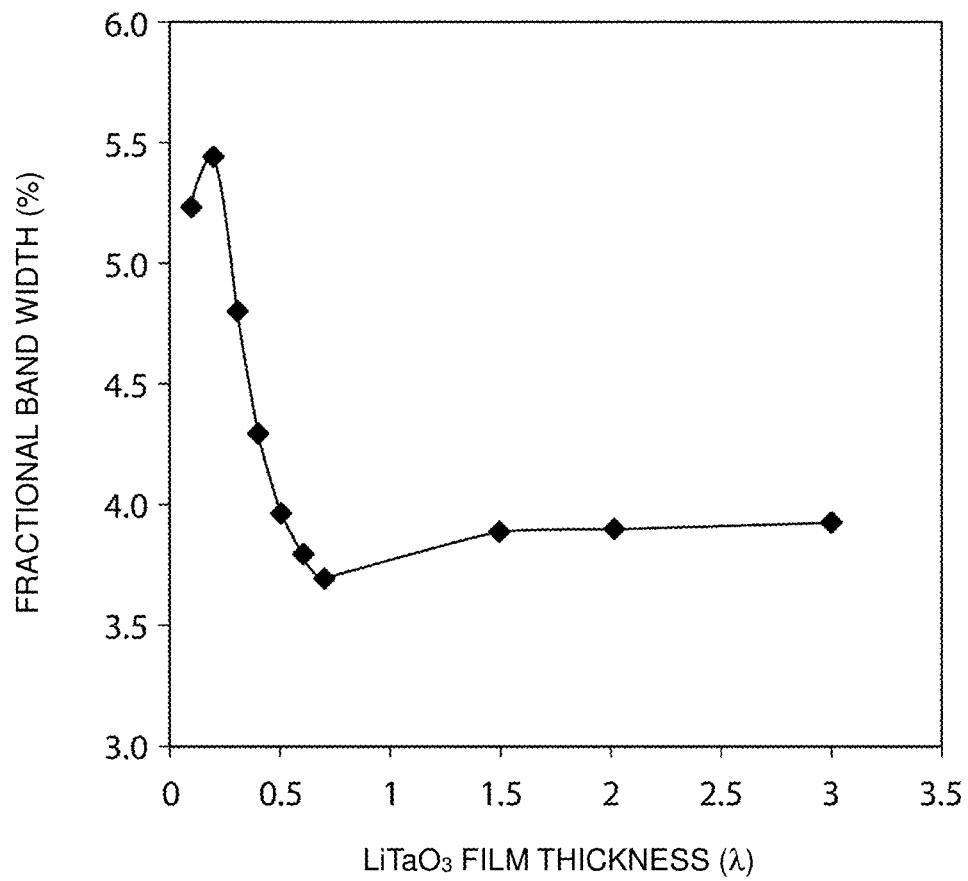
FIG. 25 is a graph that shows the relationship between the film thickness of a lithium tantalate film and a fractional band width.

As shown in FIG. 25, when the film thickness of the LiTaO$_3$ film falls within the range greater than or equal to about 0.05λ and less than or equal to about 0.5λ, the fractional band width significantly changes. Therefore, the electromechanical coupling coefficient can be adjusted within a wider range. Thus, to expand the adjustable range of each of the electromechanical coupling coefficient and fractional band width, it is preferable that the film thickness of the LiTaO$_3$ film is greater than or equal to about 0.05λ and less than or equal to about 0.5λ, for example.

Figure 26:
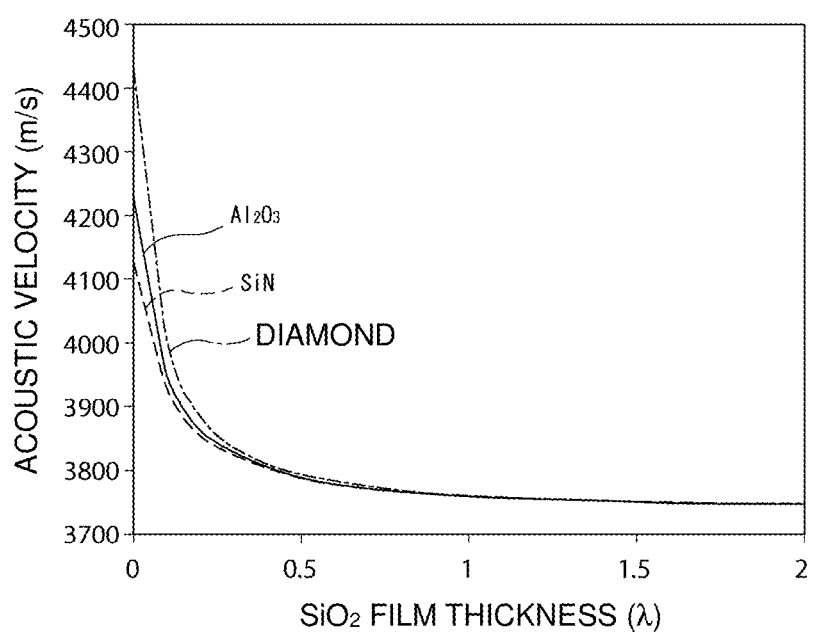
FIG. 26 is a graph that shows the relationship among the film thickness of a silicon oxide film, an acoustic velocity, and the material of a high acoustic velocity film.
Figure 27:
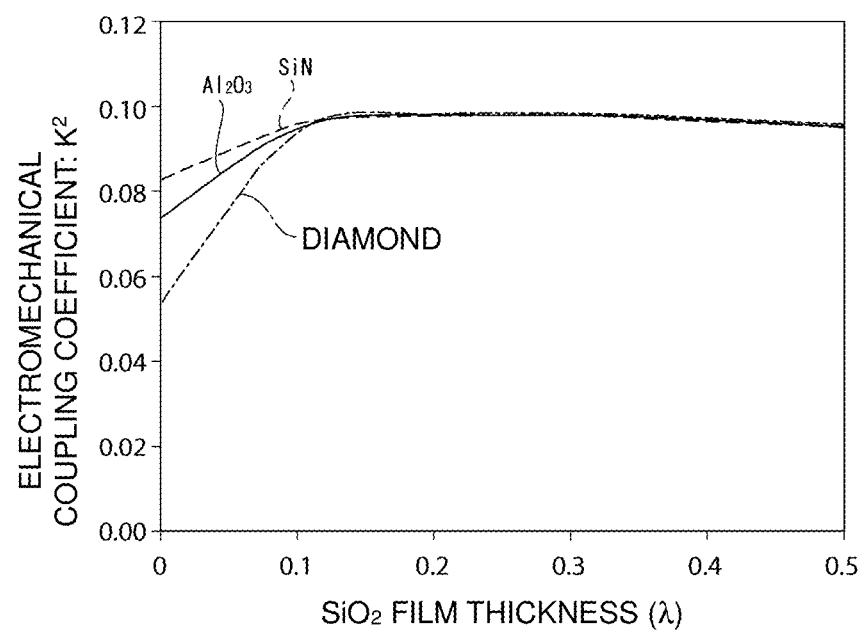
FIG. 27 is a graph that shows the relationship among the film thickness of a silicon oxide film, an electromechanical coupling coefficient, and the material of a high acoustic velocity film.

FIG. 26 is a graph that shows the relationship between the film thickness (λ) of the silicon oxide film and acoustic velocity. FIG. 27 is a graph that shows the relationship between an SiO$_2$ film thickness (λ) and an electromechanical coupling coefficient. Here, the acoustic wave device includes a low acoustic velocity film and a high acoustic velocity film that defines and functions as a high acoustic velocity material layer. A silicon nitride film, an aluminum oxide film, and diamond, for example are each preferably used as a high acoustic velocity film on the lower side of a low acoustic velocity film made of SiO$_2$. The film thickness of the high acoustic velocity film is set to about 1.5λ. The acoustic velocity of bulk waves in silicon nitride is about 6000 m/s. The acoustic velocity of bulk waves in aluminum oxide is about 6000 m/s. The acoustic velocity of bulk waves in diamond is about 12800 m/s. As shown in FIG. 26 and FIG. 27, even when the material of the high acoustic velocity film and the film thickness of the SiO₂ film are changed, the electromechanical coupling coefficient and the acoustic velocity almost do not change. Particularly, from FIG. 27, when the film thickness of the SiO₂ film is greater than or equal to about 0.1λ and less than or equal to about 0.5λ, the electromechanical coupling coefficient almost does not change regardless of the material of the high acoustic velocity film. It is found from FIG. 26 that, when the film thickness of the SiO₂ film is greater than or equal to about 0.3λ and less than or equal to about 2λ, the acoustic velocity does not change regardless of the material of the high acoustic velocity film. Therefore, the film thickness of the low acoustic velocity film made of silicon oxide is preferably less than or equal to about 2λ, and the film thickness is more preferably less than or equal to about 0.5λ, for example.

The acoustic wave device may be used as a duplexer of a radio-frequency front-end circuit, or another device. This example will be described below.

Figure 28:
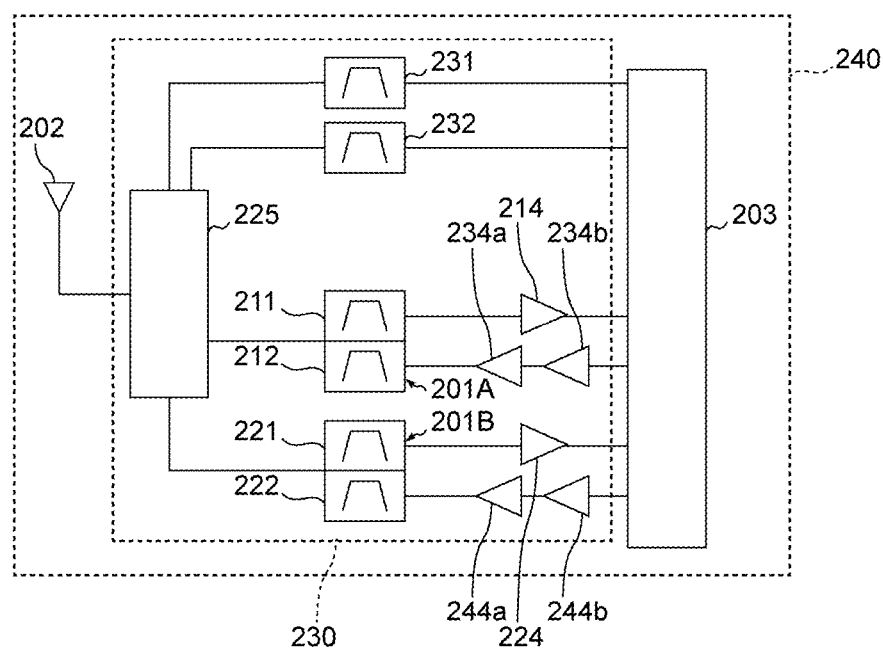
FIG. 28 is a schematic configuration diagram for illustrating a communication device and radio-frequency front-end circuit according to a preferred embodiment of the present invention.

FIG. 28 is a configuration view of a communication device including a radio-frequency front-end circuit according to a preferred embodiment of the present invention. The diagram shows the radio-frequency front-end circuit 230 and components connected to the radio-frequency front-end circuit 230. Examples of the illustrated components connected to the radio-frequency front-end circuit 230 include an antenna element 202 and an RF signal processing circuit (RFIC) 203. The radio-frequency front-end circuit 230 and the RF signal processing circuit 203 define the communication device 240. The communication device 240 may include a power supply, a CPU, or a display.

The radio-frequency front-end circuit 230 includes a switch 225, duplexers 201A, 201B, low-noise amplifier circuits 214, 224, filters 231, 232, and power amplifier circuits 234a, 234b, 244a, 244b. The radio-frequency front-end circuit 230 and the communication device 240 in FIG. 28 are examples of the radio-frequency front-end circuit and the communication device, and the radio-frequency front-end circuit and the communication device are not limited to these configurations.

The duplexer 201A includes filters 211, 212. The duplexer 201B includes filters 221, 222. The duplexers 201A, 201B are connected to the antenna element 202 via the switch 225. The acoustic wave devices according to preferred embodiments of the present invention may be the duplexer 201A or the duplexer 201B or may be the filter 211, the filter 212, the filter 221, or the filter 222. Each of the acoustic wave devices according to preferred embodiments of the present invention may be an acoustic wave resonator that is a component of the duplexer 201A, the duplexer 201B, the filter 211, the filter 212, the filter 221, or the filter 222. Furthermore, each of the acoustic wave devices according to preferred embodiments of the present invention may be applied to a configuration including three or more filters, such as a triplexer having a common antenna terminal for three filters and a hexaplexer having a common antenna terminal for six filters.

In other words, each of the acoustic wave devices according to preferred embodiments of the present invention may be an acoustic wave resonator, or may be a filter, or may be a multiplexer including two or more filters.

The switch 225 connects the antenna element 202 to a signal path that supports a predetermined band in accordance with a control signal from a control unit (not shown). The switch 225 is preferably, for example, an SPDT (single pole double throw) switch. The signal path to be connected to the antenna element 202 is not limited to one signal path and may be multiple signal paths. In other words, the radio-frequency front-end circuit 230 may support carrier aggregation.

The low-noise amplifier circuit 214 is a receiving amplifier circuit that amplifies a radio-frequency signal (here, radio-frequency reception signal) via the antenna element 202, the switch 225, and the duplexer 201A and that outputs the amplified radio-frequency signal to the RF signal processing circuit 203. The low-noise amplifier circuit 224 is a receiving amplifier circuit that amplifies a radio-frequency signal (here, radio-frequency reception signal) via the antenna element 202, the switch 225, and the duplexer 201B and that outputs the amplified radio-frequency signal to the RF signal processing circuit 203.

The power amplifier circuits 234a, 234b are each a transmission amplifier circuit that amplifies a radio-frequency signal (here, radio-frequency transmission signal) output from the RF signal processing circuit 203 and that outputs the radio-frequency signal to the antenna element 202 via the duplexer 201A and the switch 225. The power amplifier circuits 244a, 244b each are a transmission amplifier circuit that amplifies a radio-frequency signal (here, radio-frequency transmission signal) output from the RF signal processing circuit 203 and that outputs the radio-frequency signal to the antenna element 202 via the duplexer 201B and the switch 225.

The filters 231, 232 are connected between the RF signal processing circuit 203 and the switch 225 without intervening any of the low-noise amplifier circuits 214, 224 or any of the power amplifier circuits 234a, 234b, 244a, 244b. The filters 231, 232, as well as the duplexers 201A, 201B, are connected to the antenna element 202 via the switch 225.

The RF signal processing circuit 203 processes a radio-frequency reception signal input from the antenna element 202 via a reception signal path by down conversion, or the like, and outputs the processed and generated reception signal. The RF signal processing circuit 203 processes an input transmission signal by up conversion, or the like, and outputs the processed and generated radio-frequency transmission signal to the power amplifier circuits 244a, 244b. The RF signal processing circuit 203 is preferably, for example, an RFIC. The communication device may include a BB (baseband) IC. In this case, the BBIC processes a reception signal processed by the RFIC. The BBIC processes a transmission signal and outputs the processed transmission signal to the RFIC. A reception signal processed by the BBIC or a transmission signal before being processed by the BBIC is, for example, an image signal, an audio signal, or the like. The radio-frequency front-end circuit 230 may include another circuit element between the above-described components.

The radio-frequency front-end circuit 230 may include duplexers according to a modification of the duplexers 201A, 201B in place of the duplexers 201A, 201B.

The acoustic wave devices, radio-frequency front-end circuits, and communication devices according to the preferred embodiments of the present invention are described by way of the above-described preferred embodiments. However, the present invention also encompasses other preferred embodiments provided by combining selected elements of the above-described preferred embodiments, modifications obtained by applying various alterations that are conceived of by persons skilled in the art to the above-described preferred embodiments without departing from the scope of the present invention, and various devices that include the radio-frequency front-end circuit or communication device according to the present invention.

Preferred embodiments of the present invention are widely usable in an acoustic wave resonator, a filter, a multiplexer including two or more filters, a radio-frequency front-end circuit, and a communication device, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate made of silicon;
a piezoelectric body provided directly or indirectly on the support substrate, the piezoelectric body including a pair of main surfaces facing each other; and
an interdigital transducer electrode provided directly or indirectly on at least one of the main surfaces of the piezoelectric body, a wave length that is determined by an electrode finger pitch of the interdigital transducer electrode being λ; wherein
an acoustic velocity Vs, in expression (1), which is an acoustic velocity of slowest transversal waves within bulk waves that propagate in the support substrate, is higher than or equal to about 5500 m/s, $$V_{Si} = (V_1)^{1/2} \text{(m/s)} \quad \text{expression (1);}$$

where $V_1$ in the expression (1) is a solution to expression (2), $$Ax^3 + Bx^2 + Cx + D = 0 \quad \text{expression(2);}$$

where, in the expression (2), A, B, C, and D are respectively values expressed by expressions (2A) to (2D), $$A = -\rho^3 \quad \text{expression (2A),}$$

$$B = \rho^2(L_{11} + L_{22} + L_{33}) \quad \text{expression (2B),}$$

$$C = \rho(L_{21}^2 + L_{23}^2 + L_{31}^2 - L_{11} \cdot L_{33} - L_{22} \cdot L_{33} - L_{11} \cdot L_{22}) \quad \text{expression (2C), and}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \quad \text{expression (2D);}$$

where, in the expression (2A), the expression (2B), the expression (2C), or the expression (2D), ρ is about 2.331 (g/cm³), and $L_{11}$, $L_{22}$, $L_{33}$, $L_{21}$, $L_{31}$, and $L_{23}$ are values expressed by expressions (3A) to (3F), $$L_{11} = c_{11} \cdot a_1^2 + c_{44} \cdot a_2^2 + c_{44} \cdot a_3^2 \quad \text{expression (3A),}$$

$$L_{22} = c_{44} \cdot a_1^2 + c_{11} \cdot a_2^2 + c_{44} \cdot a_3^2 \quad \text{expression (3B),}$$

$$L_{33} = c_{44} \cdot a_1^2 + c_{44} \cdot a_2^2 + c_{11} \cdot a_3^2 \quad \text{expression (3C),}$$

$$L_{21} = (c_{12} + c_{44}) \cdot a_2 \cdot a_1 \quad \text{expression (3D),}$$

$$L_{31} = (c_{12} + c_{44}) \cdot a_1 \cdot a_3 \quad \text{expression (3E), and}$$

$$L_{23} = (c_{44} + c_{12}) \cdot a_3 \cdot a_2 \quad \text{expression (3F);}$$

where, in the expressions (3A) to (3F), $c_{11}$ is about 1.674E+11 (N/m²), $c_{12}$ is about 6.523E+10 (N/m²), and $c_{44}$ is about 7.957E+10 (N/m²), and $a_1$, $a_2$, and $a_3$ are values expressed by expressions (4A) to (4C), $$a_1 = \cos(\phi) \cdot \cos(\psi) - \sin(\phi) \cdot \cos(\theta) \cdot \sin(\psi) \quad \text{expression (4A),}$$

$$a_2 = \sin(\phi) \cdot \cos(\psi) + \cos(\phi) \cdot \cos(\theta) \cdot \sin(\psi) \quad \text{expression (4B), and}$$

$$a_3 = \sin(\theta) \cdot \sin(\psi) \quad \text{expression (4C);}$$

where $\phi$, $\theta$, and $\psi$ in the mathematical expressions (4A) to (4C) are $\phi$, $\theta$, and $\psi$ in a crystal orientation ($\phi$, $\theta$, $\psi$) of the support substrate.

2. The acoustic wave device according to claim 1, further comprising a low acoustic velocity material layer provided between the support substrate and the piezoelectric body, the low acoustic velocity material layer being made of a low acoustic velocity material through which bulk waves propagate at an acoustic velocity lower than an acoustic velocity of acoustic waves that propagate through the piezoelectric body.

3. The acoustic wave device according to claim 2, wherein a film thickness of the low acoustic velocity material layer is less than or equal to about 2λ.

4. The acoustic wave device according to claim 2, wherein the low acoustic velocity material layer is made of silicon oxide.

5. The acoustic wave device according to claim 2, wherein the piezoelectric body is made of lithium tantalate, and the low acoustic velocity material layer is made of silicon oxide.

6. The acoustic wave device according to claim 2, further comprising a high acoustic velocity material layer provided between the support substrate and the low acoustic velocity material layer, the high acoustic velocity material layer being made of a high acoustic velocity material through which bulk waves propagate at an acoustic velocity higher than an acoustic velocity of acoustic waves that propagate through the piezoelectric body.

7. The acoustic wave device according to claim 1, further comprising a dielectric layer provided between the piezoelectric body and the interdigital transducer electrode.

8. The acoustic wave device according to claim 7, wherein the dielectric layer is made of silicon oxide or tantalum pentoxide.

9. The acoustic wave device according to claim 8, wherein the dielectric layer is made of silicon oxide.

10. The acoustic wave device according to claim 1, further comprising:
a support layer provided on the support substrate and surrounding the interdigital transducer electrode;
a cover member covering the support layer and providing a hollow space surrounding the interdigital transducer electrode; and
a plurality of metal bumps provided on the cover member and electrically connected to the interdigital transducer electrode.

11. An acoustic wave device package comprising:
a case substrate on one of surfaces of which a plurality of electrode lands is provided; and
the acoustic wave device according to claim 10, the acoustic wave device being mounted on the case substrate; wherein
the plurality of metal bumps are joined with the plurality of electrode lands on the case substrate; and
the acoustic wave device package further includes a sealing resin layer provided so as to seal the acoustic wave device.

12. The acoustic wave device according to claim 1, wherein $V_1$ in the expression (1) is a minimum value among solutions $V_1$, $V_2$, and $V_3$ to the expression (2).

13. The acoustic wave device according to claim 1, wherein a film thickness of the piezoelectric body is less than or equal to about $3.5\lambda$.

14. The acoustic wave device according to claim 1, wherein the piezoelectric body is made of lithium tantalate.

15. The acoustic wave device according to claim 1, wherein the acoustic velocity of bulk waves that propagate through the support substrate is higher than an acoustic velocity of acoustic waves that propagate through the piezoelectric body.

16. A multiplexer comprising:
a plurality of band pass filters having different pass bands; wherein
the acoustic wave device according to claim 1 is used in one of the plurality of band pass filters whose pass band is lower than the pass band of at least another one of the plurality of band pass filters.

17. The acoustic wave device according to claim 1, wherein a thickness of the support substrate is greater than or equal to about $10\lambda$ and less than or equal to about 180 µm, and $\lambda$ is less than or equal to about 18 µm.

18. The acoustic wave device according to claim 1, further comprising:
a support layer provided on the support substrate and surrounding the interdigital transducer electrode; and
a cover member covering the support layer, the cover member providing a hollow space surrounding the interdigital transducer electrode, the cover member being made of an inorganic material; wherein
in a region surrounded by the support layer, at least one through via extending through the support substrate and at least one terminal electrode electrically connected to the at least one through via and provided on a surface on an opposite side of the support substrate from a side on which the interdigital transducer electrode is provided, are provided on or in the support substrate; and
the at least one through via is electrically connected to the interdigital transducer electrode and the at least one terminal electrode.

19. An acoustic wave device package comprising:
a case substrate on one of surfaces of which a plurality of electrode lands is provided; and
the acoustic wave device according to claim 1, the acoustic wave device being mounted on the case substrate; wherein
at least one metal bump electrically connected to the interdigital transducer electrode is provided on the acoustic wave device;
the at least one metal bump is joined with at least one of the plurality of electrode lands; and
the acoustic wave device package further includes a sealing resin layer provided on the case substrate so as to seal the acoustic wave device.

20. A multiplexer comprising:
a band pass filter including the acoustic wave device according to claim 1; and
at least another band pass filter whose one end is connected to one end of the band pass filter; wherein
a frequency position of a higher mode in the acoustic wave device lies outside a pass band of the at least another band pass filter.

* * * * *